(12) United States Patent
Tsutsumi et al.

(10) Patent No.: US 11,894,298 B2
(45) Date of Patent: Feb. 6, 2024

(54) THREE-DIMENSIONAL MEMORY DEVICE CONTAINING AMORPHOUS AND CRYSTALLINE BLOCKING DIELECTRIC LAYERS

(71) Applicant: SANDISK TECHNOLOGIES LLC, Addison, TX (US)

(72) Inventors: Masanori Tsutsumi, Yokkaichi (JP); Naohiro Hosoda, Yokkaichi (JP); Shuichi Hamaguchi, Yokkaichi (JP); Kazuki Isozumi, Yokkaichi (JP); Genta Mizuno, Yokkaichi (JP); Yusuke Mukae, Yokkaichi (JP); Ryo Nakamura, Yokkaichi (JP); Yu Ueda, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/655,827

(22) Filed: Mar. 22, 2022

(65) Prior Publication Data
US 2022/0216145 A1    Jul. 7, 2022

Related U.S. Application Data

(63) Continuation of application No. 16/695,775, filed on Nov. 26, 2019, now Pat. No. 11,289,416.

(51) Int. Cl.
*H01L 23/522* (2006.01)
*H01L 23/532* (2006.01)
(Continued)

(52) U.S. Cl.
CPC .... *H01L 23/5226* (2013.01); *H01L 23/53223* (2013.01); *H10B 41/10* (2023.02);
(Continued)

(58) Field of Classification Search
CPC ......... H01L 27/11524; H01L 27/11529; H01L 27/11519; H01L 27/11556;
(Continued)

(56) References Cited

U.S. PATENT DOCUMENTS 5,915,167 A    6/1999  Leedy
9,230,974 B1   1/2016  Pachamuthu et al.
(Continued)

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

*Primary Examiner* — Calvin Y Choi
(74) *Attorney, Agent, or Firm* — THE MARBURY LAW GROUP PLLC

(57) ABSTRACT

A semiconductor structure includes an alternating stack of insulating layers and electrically conductive layers located over a substrate, memory openings vertically extending through the alternating stack, memory opening fill structures located in the memory openings, where each of the memory opening fill structures contains a memory film and a vertical semiconductor channel that extend vertically, and each memory film includes a crystalline blocking dielectric metal oxide layer, and a metal oxide amorphous dielectric nucleation layer located between each of the vertically neighboring electrically conductive layers and insulating layers, and located between each of the crystalline blocking dielectric metal oxide layers and each of the electrically conductive layers.

20 Claims, 25 Drawing Sheets

(51) Int. Cl.
*H10B 41/10* (2023.01)
*H10B 41/27* (2023.01)
*H10B 41/35* (2023.01)
*H10B 43/10* (2023.01)
*H10B 43/27* (2023.01)
*H10B 43/35* (2023.01)

(52) U.S. Cl.
CPC ............ *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ........... H01L 27/11565; H01L 27/1157; H01L 27/11582; H01L 23/5226; H01L 23/53223; H01L 29/40117; H10B 41/10; H10B 41/227; H10B 41/35; H10B 43/10; H10B 43/27; H10B 43/35; H10B 43/50
See application file for complete search history.

(56) References Cited

U.S. PATENT DOCUMENTS

| | | |
|---|---|---|
| 9,305,937 B1 | 4/2016 | Tsutsumi et al. |
| 9,478,558 B2 | 10/2016 | Koka et al. |
| 9,613,977 B2 | 4/2017 | Sharangpani et al. |
| 9,659,955 B1 | 5/2017 | Sharangpani et al. |
| 9,659,956 B1 | 5/2017 | Pachamuthu et al. |
| 9,875,929 B1 | 1/2018 | Pachamuthu et al. |
| 9,991,277 B1 | 6/2018 | Tsutsumi et al. |
| 10,355,139 B2 | 7/2019 | Sharangpani et al. |
| 10,361,213 B2 | 7/2019 | Sharangpani et al. |
| 10,516,025 B1 | 12/2019 | Nishikawa et al. |
| 10,804,282 B2 | 10/2020 | Baraskar et al. |
| 10,861,869 B2 | 12/2020 | Nakamura et al. |
| 11,049,807 B2 | 6/2021 | Li et al. |
| 11,289,416 B2 * | 3/2022 | Tsutsumi ............... H10B 41/35 |
| 2016/0111439 A1 | 4/2016 | Tsutsumi et al. |
| 2016/0211272 A1 | 7/2016 | Koka et al. |
| 2016/0379989 A1 | 12/2016 | Sharangpani et al. |
| 2017/0125436 A1 | 5/2017 | Sharangpani et al. |
| 2017/0373079 A1 | 12/2017 | Sharangpani et al. |
| 2018/0090373 A1 * | 3/2018 | Sharangpani .......... H10B 41/35 |
| 2018/0151588 A1 | 5/2018 | Tsutsumi et al. |
| 2018/0374866 A1 | 12/2018 | Makala et al. |
| 2019/0139973 A1 | 5/2019 | Zhou et al. |
| 2019/0287916 A1 | 9/2019 | Sharangpani et al. |
| 2019/0287982 A1 | 9/2019 | Hinoue et al. |
| 2019/0386108 A1 | 12/2019 | Nishikawa et al. |
| 2020/0020715 A1 | 1/2020 | Nakamura et al. |
| 2020/0258896 A1 | 8/2020 | Baraskar et al. |
| 2021/0090992 A1 | 3/2021 | Li et al. |
| 2021/0159167 A1 | 5/2021 | Tsutsumi et al. |

* cited by examiner

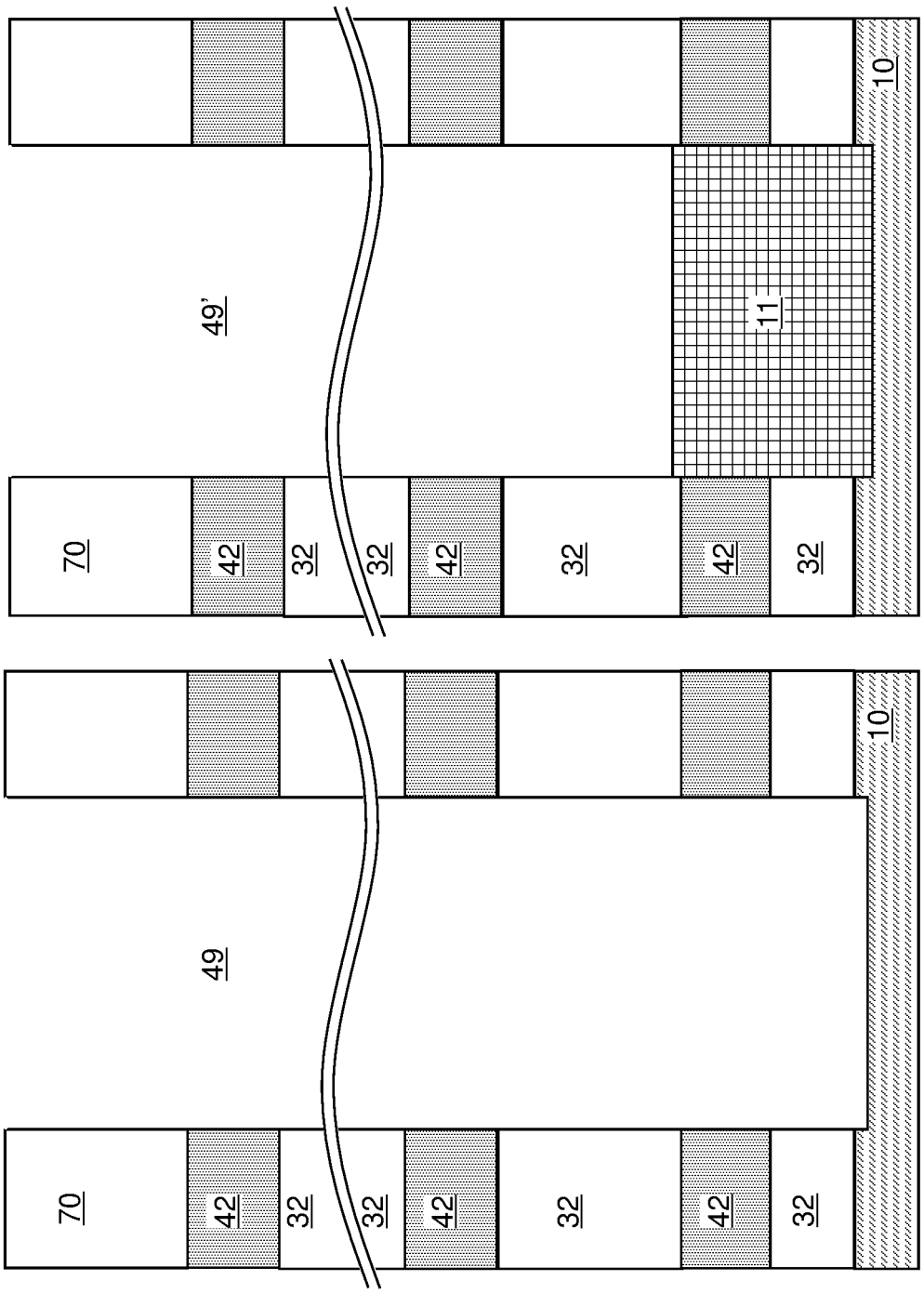

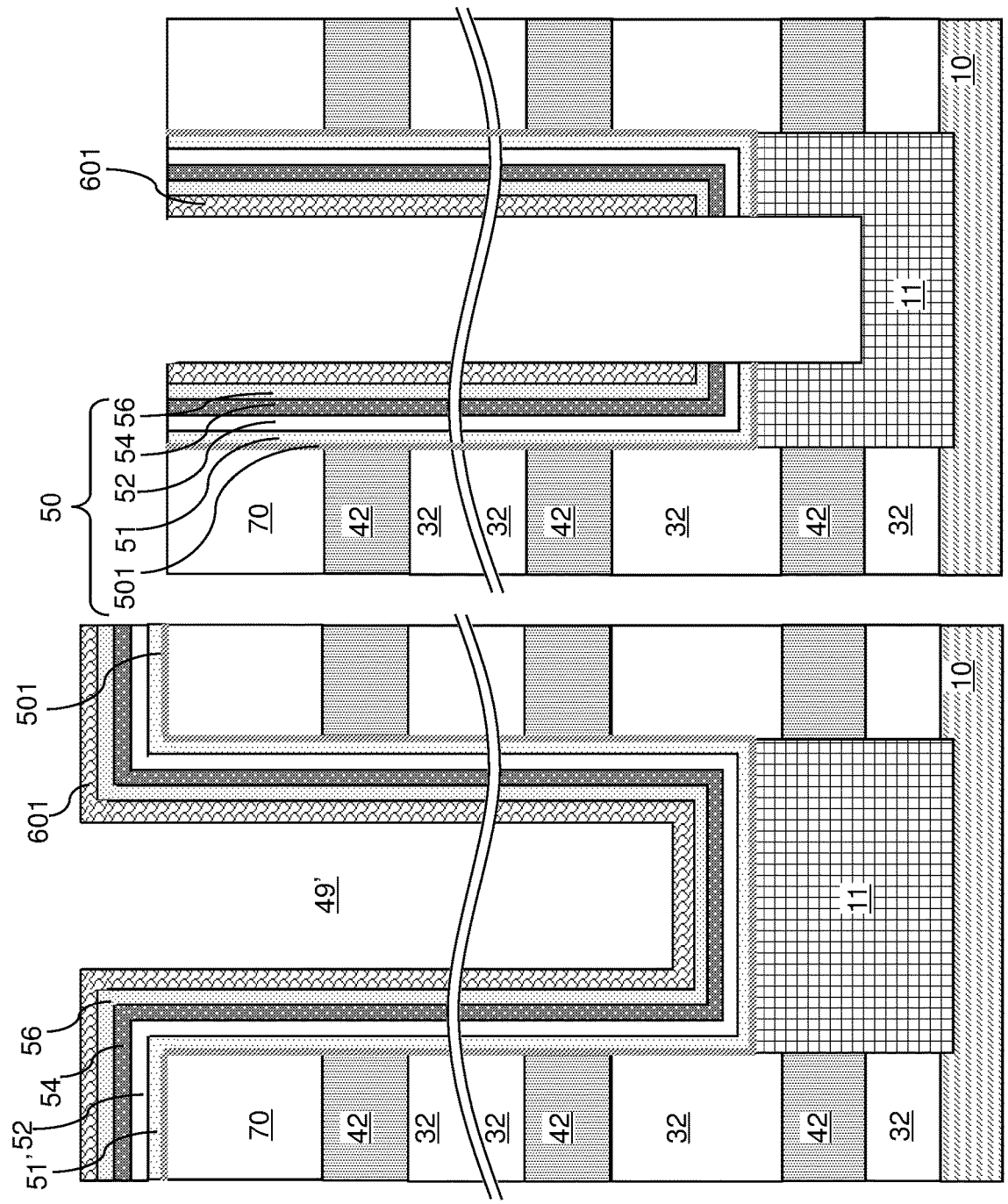

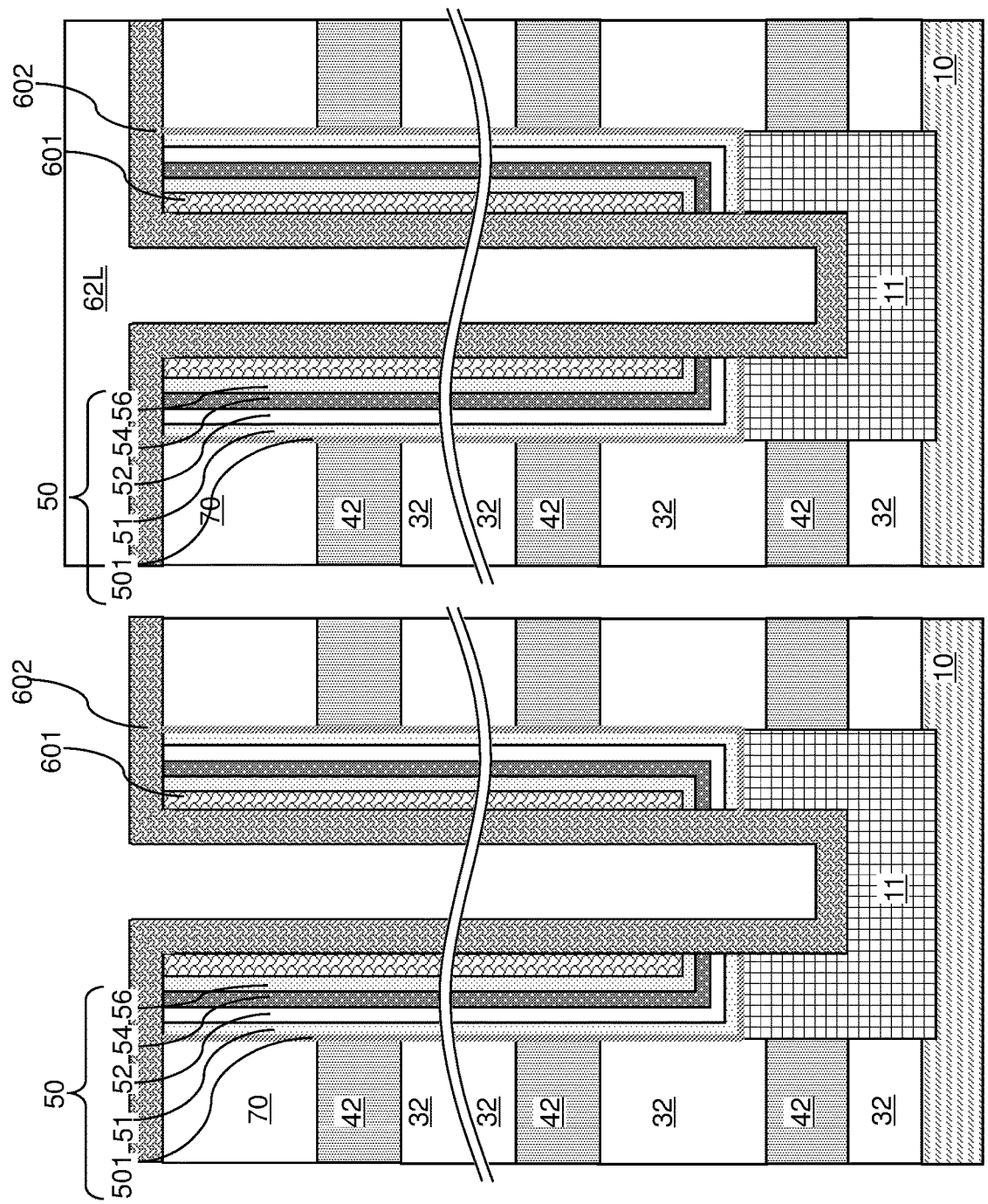

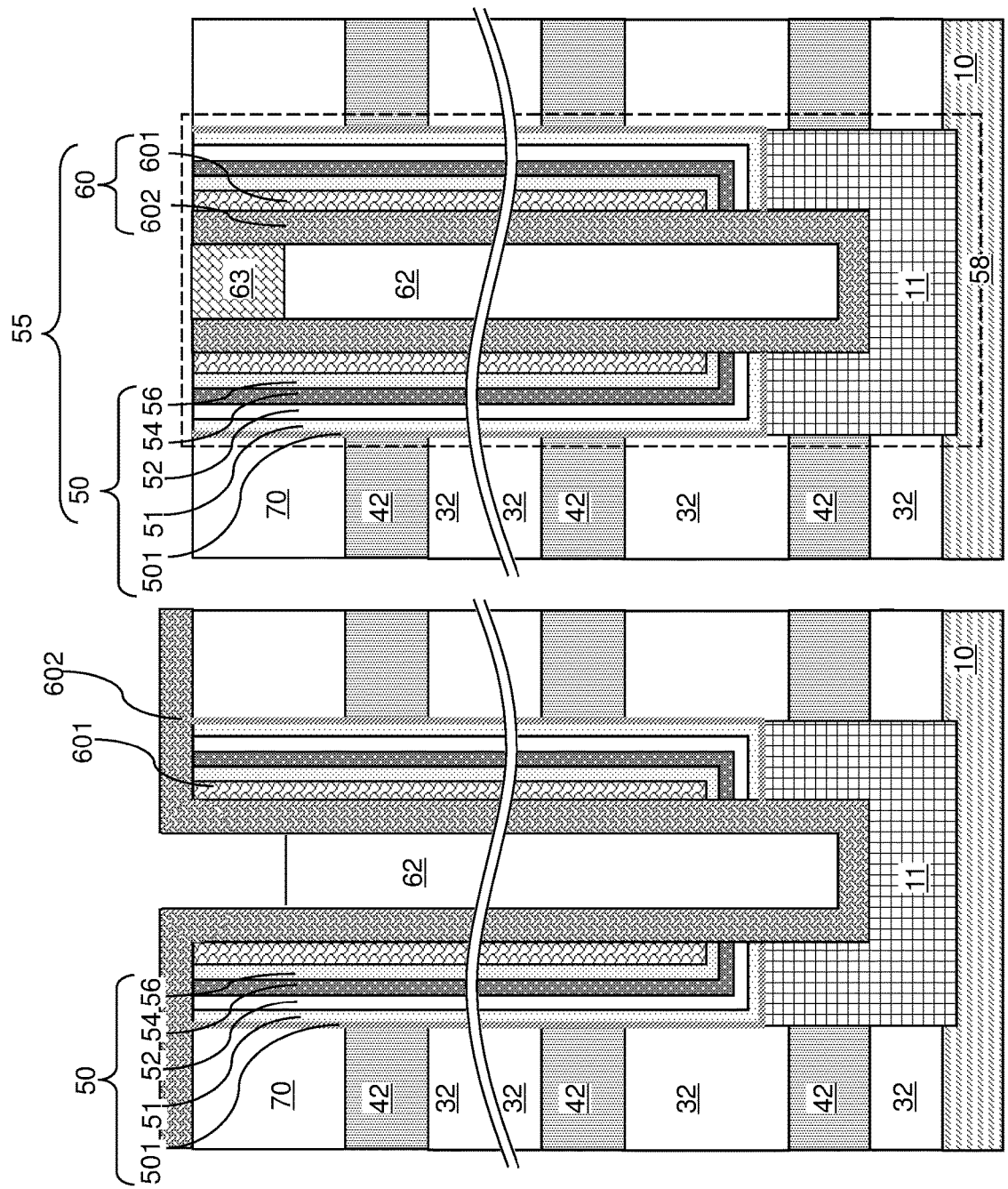

THREE-DIMENSIONAL MEMORY DEVICE CONTAINING AMORPHOUS AND CRYSTALLINE BLOCKING DIELECTRIC LAYERS

FIELD

The present disclosure relates generally to the field of semiconductor devices and specifically to a three-dimensional memory structure containing amorphous and crystalline blocking dielectric layers and methods of making thereof.

BACKGROUND

Three-dimensional vertical NAND strings having one bit per cell are disclosed in an article by T. Endoh, et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a semiconductor structure is provided, which comprises: forming an alternating stack of insulating layers and sacrificial material layers over a substrate; forming memory openings vertically extending through the alternating stack; forming memory opening fill structures in the memory openings, wherein each of the memory opening fill structures comprises a memory film and a vertical semiconductor channel that extend vertically, and each memory film comprises a blocking dielectric metal oxide layer; forming backside recesses by removing the sacrificial material layers selective to the insulating layers and the memory opening fill structures; forming an amorphous dielectric nucleation layer including an amorphous dielectric metal oxide material on physically exposed surfaces of the insulating layers and outer sidewalls of the blocking dielectric metal oxide layers; and forming electrically conductive layers in remaining volumes of the backside recesses employing a nucleation process that forms a crystalline metallic liner on the amorphous dielectric nucleation layer.

According to another aspect of the present disclosure, a semiconductor structure includes an alternating stack of insulating layers and electrically conductive layers located over a substrate, memory openings vertically extending through the alternating stack, memory opening fill structures located in the memory openings, where each of the memory opening fill structures contains a memory film and a vertical semiconductor channel that extend vertically, and each memory film includes a crystalline blocking dielectric metal oxide layer, and a metal oxide amorphous dielectric nucleation layer located between each of the vertically neighboring electrically conductive layers and insulating layers, and located between each of the crystalline blocking dielectric metal oxide layers and each of the electrically conductive layers.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

DETAILED DESCRIPTION

Figure 1:
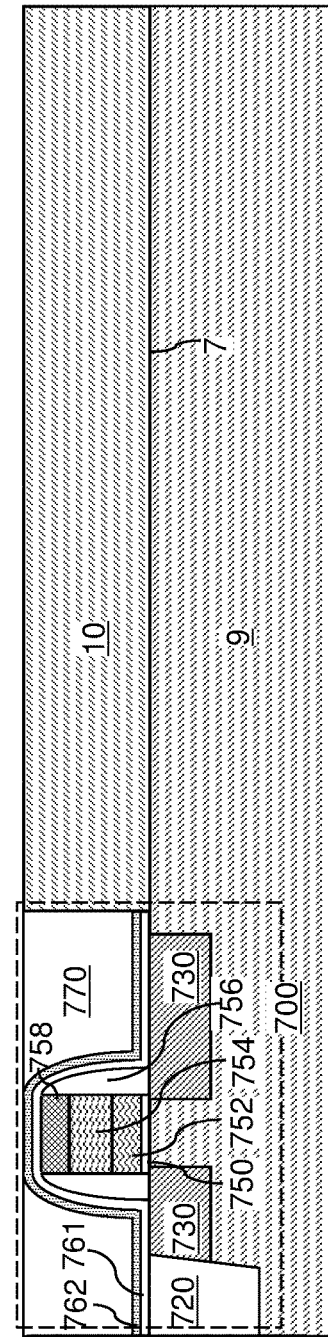
FIG. 1 is a schematic vertical cross-sectional view of an exemplary structure after formation of at least one peripheral device and a semiconductor material layer according to an embodiment of the present disclosure.

As discussed above, the embodiments of the present disclosure are directed to a three-dimensional memory device containing crystalline and amorphous blocking dielectric layers, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped surfaces of electrically conductive layers can be provided between the memory array region 100 and the peripheral device region 200.

Figure 2:
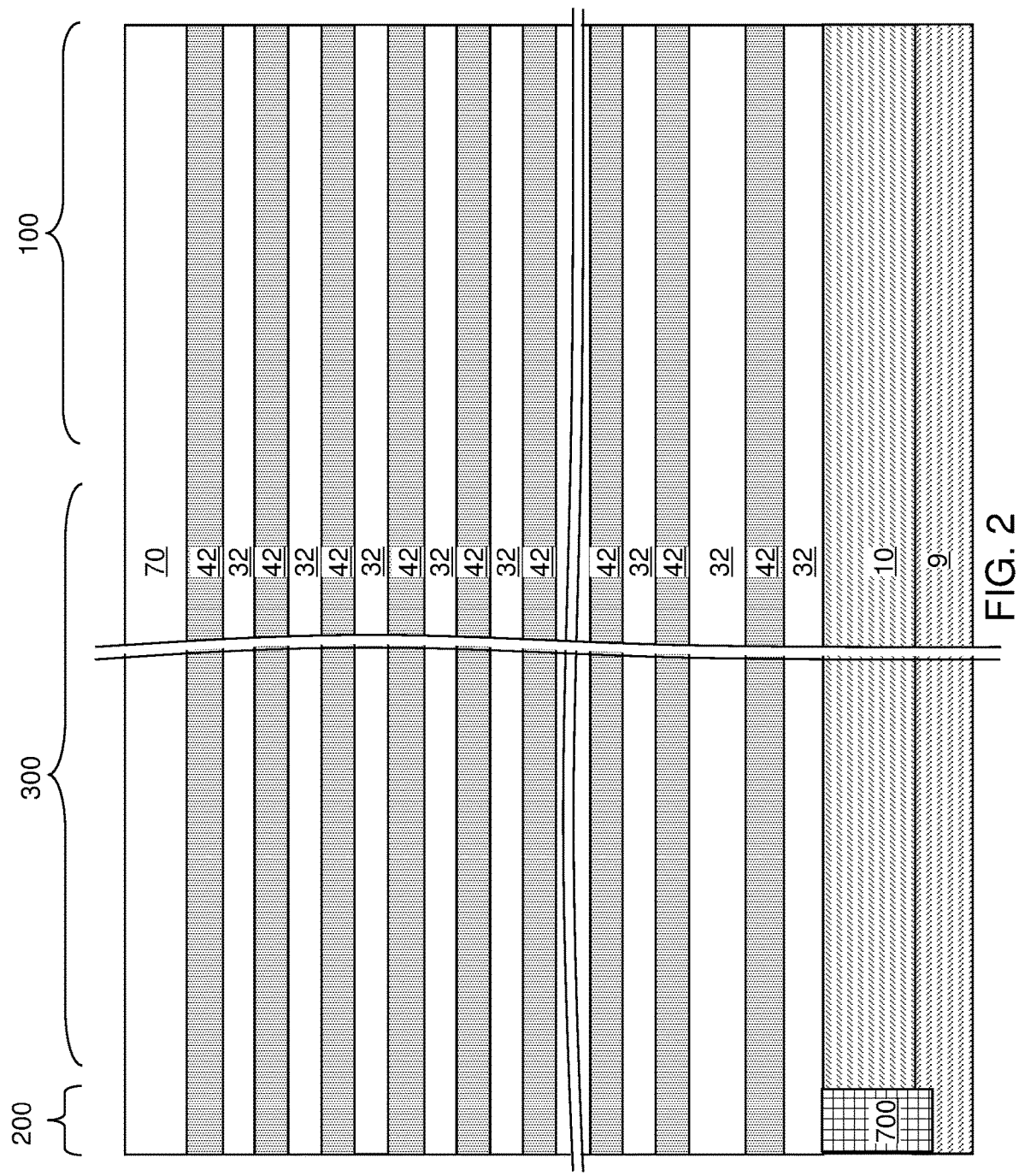
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
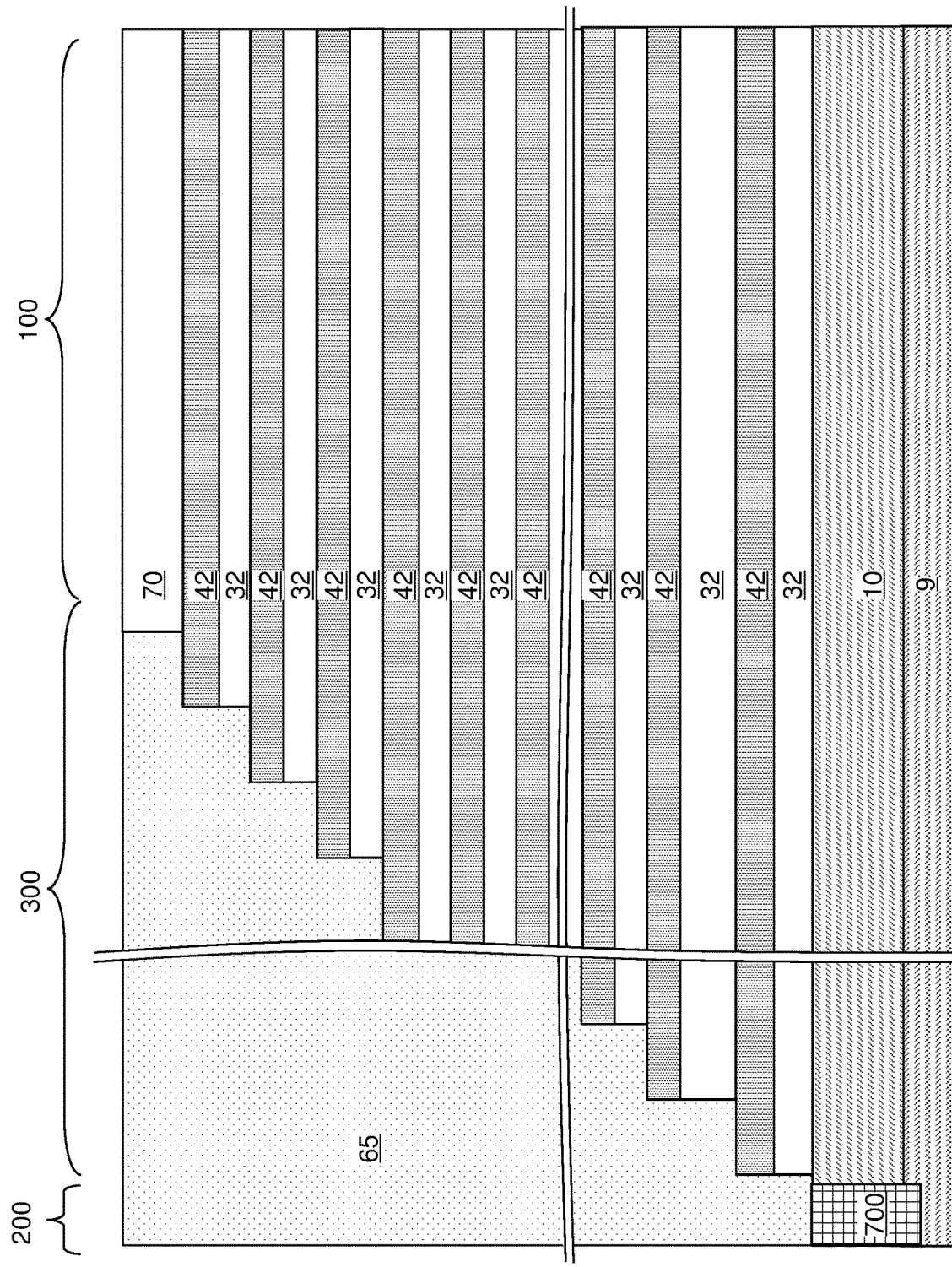
FIG. 3 is a schematic vertical cross-sectional view of the exemplary structure after formation of stepped surfaces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
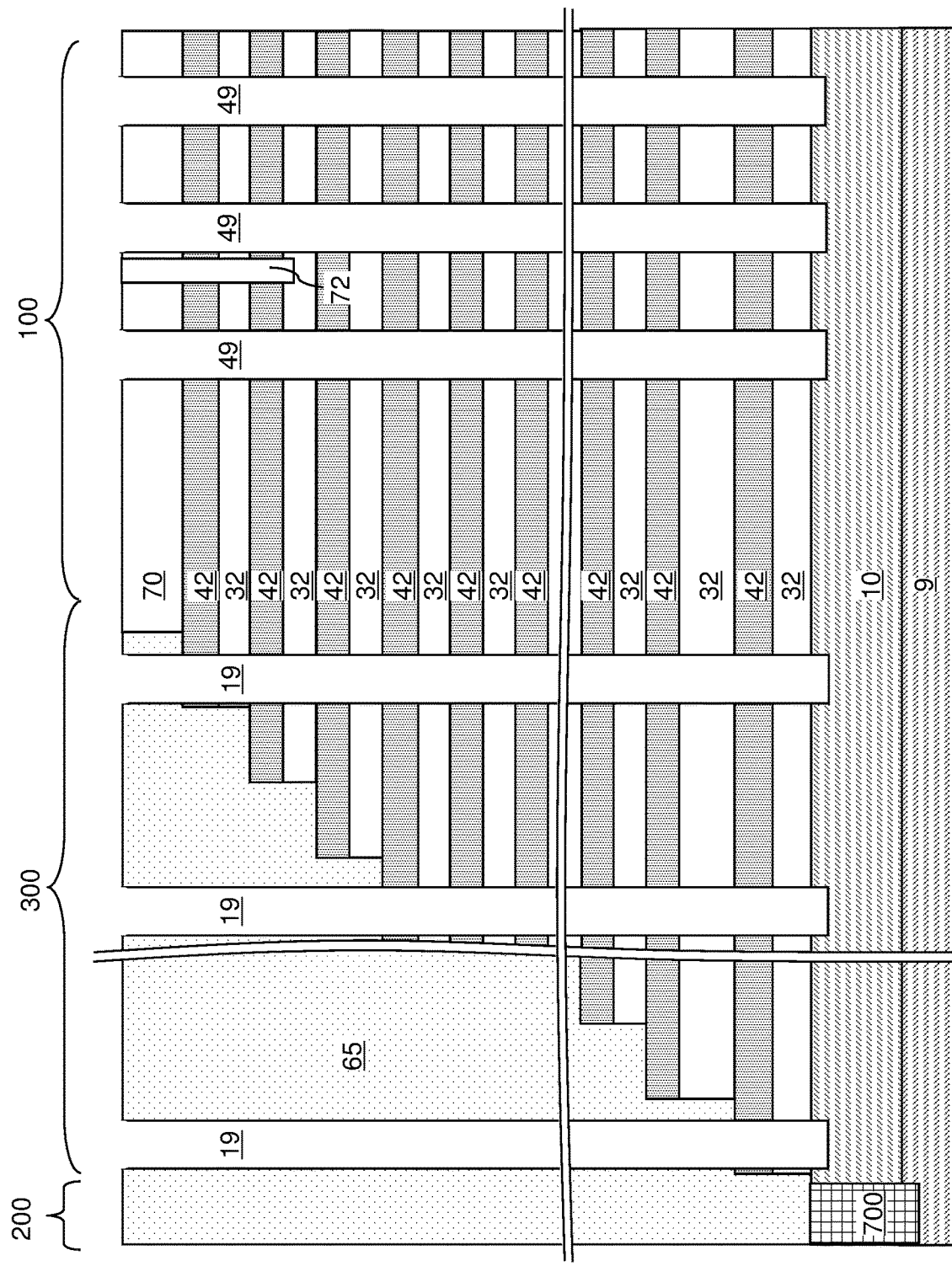
FIG. 4A is a schematic vertical cross-sectional view of the exemplary structure after formation of memory openings and support openings according to an embodiment of the present disclosure.
Figure 4B:
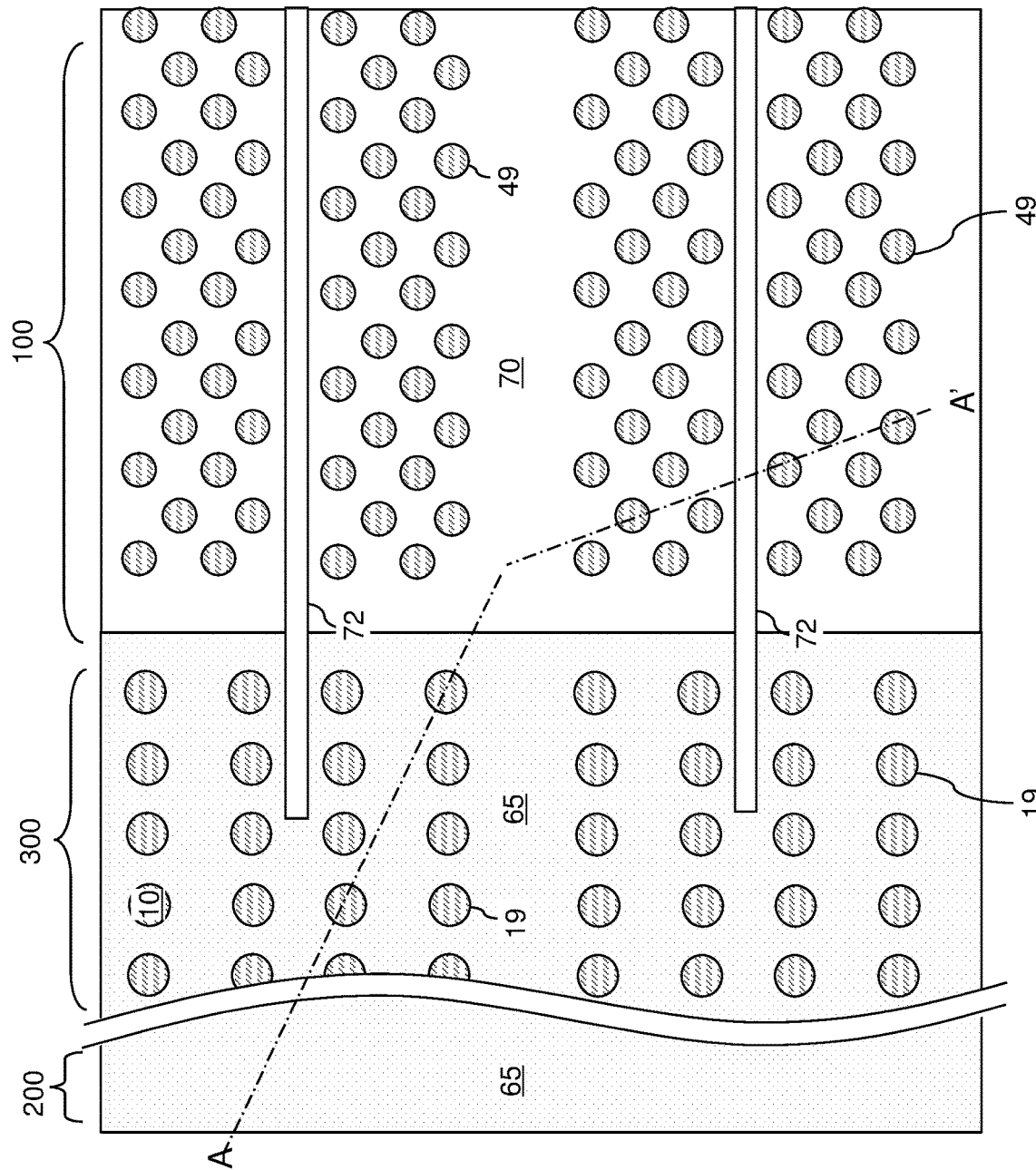
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional silicon oxide liner 501, an amorphous blocking dielectric metal oxide layer 51', a blocking dielectric semiconductor compound layer 52, a charge storage layer 54, a tunneling dielectric layer 56, and an optional first semiconductor channel layer 601 can be sequentially deposited in the memory openings 49.

The optional silicon oxide liner 501 is an optional layer that may, or may not, be present. If present, the silicon oxide liner 501 can include a conformal layer of silicon oxide, and can have a thickness in a range from 0.5 nm to 5 nm, such as from 1 nm to 3 nm. The silicon oxide liner 501 may be subsequently employed as an etch stop layer during formation of backside recesses.

The amorphous blocking dielectric metal oxide layer 51' can be formed as an amorphous dielectric metal oxide layer by a conformal deposition process. The amorphous dielectric metal oxide layer includes an amorphous dielectric material that includes at least one metallic element and at least oxygen. The amorphous dielectric metal oxide layer may consist essentially of the at least one metallic element and oxygen, or may consist essentially of the at least one metallic element, oxygen, and at least one non-metallic element such as nitrogen. In one embodiment, the amorphous blocking dielectric metal oxide layer 51' can include an amorphous dielectric metal oxide having a dielectric constant greater than 7.9, i.e., having a dielectric constant greater than the dielectric constant of silicon nitride.

Non-limiting examples of dielectric metal oxide materials that may be employed for the amorphous blocking dielectric metal oxide layer 51' include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The amorphous blocking dielectric metal oxide layer 51' can be deposited, for example, by chemical vapor deposition (CVD), atomic layer deposition (ALD), pulsed laser deposition (PLD), liquid source misted chemical deposition, or a combination thereof. The thickness of the amorphous blocking dielectric metal oxide layer 51' can be in a range from 1 nm to 20 nm, although lesser and greater thicknesses can also be employed. The amorphous blocking dielectric metal oxide layer 51' can subsequently function as a blocking dielectric material portion that blocks leakage of stored electrical charges to control gate electrodes.

In one embodiment, the amorphous blocking dielectric metal oxide layer 51' consists essentially of a dielectric metal oxide material. The amorphous blocking dielectric metal oxide layer 51' can be formed as an amorphous dielectric metal oxide layer, and is subsequently converted into a crystalline (e.g., polycrystalline) blocking dielectric metal oxide layer by an anneal process, as shown in FIG. 5D. In one embodiment, the amorphous blocking dielectric metal oxide layer 51' consists essentially of an aluminum oxide material, which is herein referred to as first aluminum oxide material. The first aluminum oxide material can be deposited in an amorphous phase, and is subsequently converted into a polycrystalline aluminum oxide material layer 51. The amorphous blocking dielectric metal oxide layer 51' is formed directly on the silicon oxide liner 501 (if present) or on sidewalls of the insulating layers 32 and the sacrificial material layers 42 as a continuous material layer within each of the memory openings 49.

The blocking dielectric semiconductor compound layer 52 can include a dielectric semiconductor compound material such as silicon oxide, silicon oxynitride, or a combination thereof. In one embodiment, the blocking dielectric semiconductor compound layer 52 can include, and/or can consist essentially of, silicon oxide. In this case, the dielectric semiconductor compound material can be formed by a conformal deposition method such as low pressure chemical vapor deposition, atomic layer deposition, or a combination thereof. The thickness of the blocking dielectric semiconductor compound layer 52 can be in a range from 1 nm to 20 nm, such as 2 nm to 5 nm, although lesser and greater thicknesses can also be employed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric semiconductor compound layer 52, the amorphous blocking dielectric metal oxide layer 51' and the optional silicon oxide liner 501 are sequentially anisotropically etched employing at least one anisotropic etch process. The portions of the first semiconductor channel layer 601, the tunneling dielectric layer 56, the charge storage layer 54, the blocking dielectric semiconductor compound layer 52, the amorphous blocking dielectric metal oxide layer 51' and the silicon oxide liner 501 located above the top surface of the insulating cap layer 70 can be removed by the at least one anisotropic etch process. Further, the horizontal portions of the first semiconductor channel layer 601, the tunneling dielectric layer 56, the charge storage layer 54, the blocking dielectric semiconductor compound layer 52, the amorphous blocking dielectric metal oxide layer 51', and the silicon oxide liner 501 at a bottom of each memory cavity 49' can be removed to form openings in remaining portions thereof. Each of the first semiconductor channel layer 601, the tunneling dielectric layer 56, the charge storage layer 54, the blocking dielectric semiconductor compound layer 52, the amorphous blocking dielectric metal oxide layer 51', and the silicon oxide liner 501 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, the blocking dielectric semiconductor compound layer 52, the amorphous blocking dielectric metal oxide layer 51' and the silicon oxide liner 501. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. Each contiguous set of the optional silicon oxide liner 501, an amorphous blocking dielectric metal oxide layer 51', a blocking dielectric semiconductor compound layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric semiconductor compound layer 52 and the tunneling dielectric layer 56. In one embodiment, the first semiconductor channel layer 601, the tunneling dielectric layer 56, the charge storage layer 54, the blocking dielectric semiconductor compound layer 52, and the amorphous blocking dielectric metal oxide layer 51' in each memory film 50 can have vertically coincident sidewalls.

An anneal process may be carried out at this step in the process in which each amorphous blocking dielectric metal oxide layer 51' is converted into a respective crystalline blocking dielectric metal oxide layer 51. The amorphous dielectric material in the amorphous blocking dielectric metal oxide layers 51' crystalizes during the anneal process, and is converted into a crystalline blocking dielectric metal oxide material. Thus, the crystalline blocking dielectric metal oxide layers 51 include, and/or consist essentially of, a crystalline dielectric metal oxide material. If the amorphous blocking dielectric metal oxide layers 51' include, and/or consist essentially of, a first amorphous aluminum oxide material, the crystalline blocking dielectric metal oxide layers 51 include, and/or consist essentially of, a polycrystalline aluminum oxide material. Alternatively, the anneal may be conducted at a later step.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, a blocking dielectric semiconductor compound layer 52, a crystalline blocking dielectric metal oxide layer 51 and an optional silicon oxide liner 501 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising portions of the charge storage layer 54, a blocking dielectric semiconductor compound layer 52, the crystalline blocking dielectric metal oxide layer 51 and the optional silicon oxide liner 501. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Generally, memory opening fill structures 58 are formed in the memory openings 49. Each of the memory opening fill structures 58 comprises a memory film 50 and a vertical semiconductor channel 60 that extend vertically. Each memory film 50 comprises a crystalline blocking dielectric metal oxide layer 51. Each of the crystalline blocking dielectric metal oxide layers 51 is formed within a respective one of the memory openings 49. A blocking dielectric semiconductor compound layer (e.g., a silicon oxide layer) 52 can be formed on a respective one of the crystalline blocking dielectric metal oxide layers 51 within each of the memory openings 49. A charge storage layer 54 and a tunneling dielectric layer 56 are formed on a respective one of the blocking dielectric semiconductor compound layers 52 within each of the memory openings 49. Drain regions 63 are formed in the memory opening fill structures 58 at an upper end of a respective one of the semiconductor channels 60.

Figure 6:
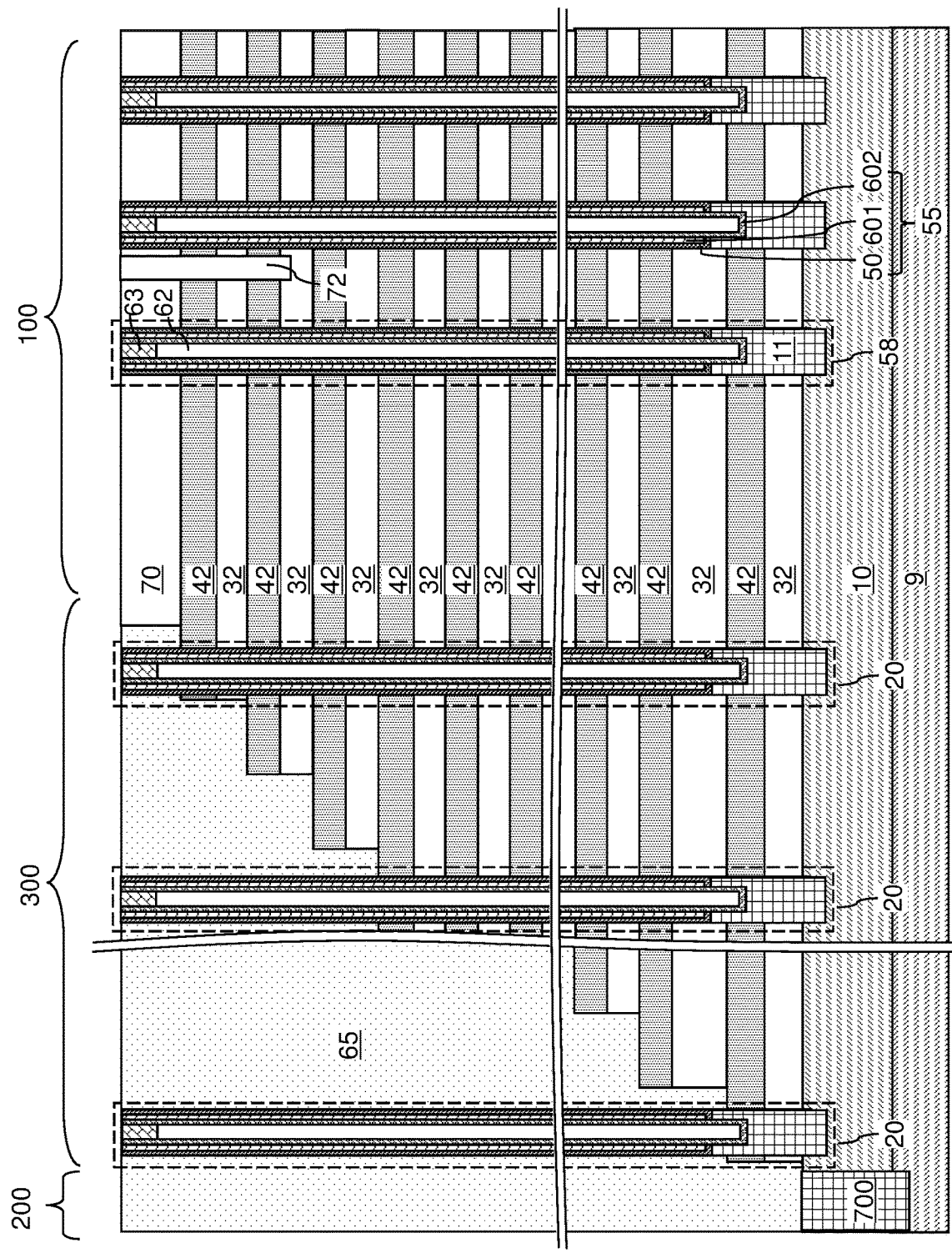
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, a blocking dielectric semiconductor compound layer 52, and a crystalline blocking dielectric metal oxide layer 51. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
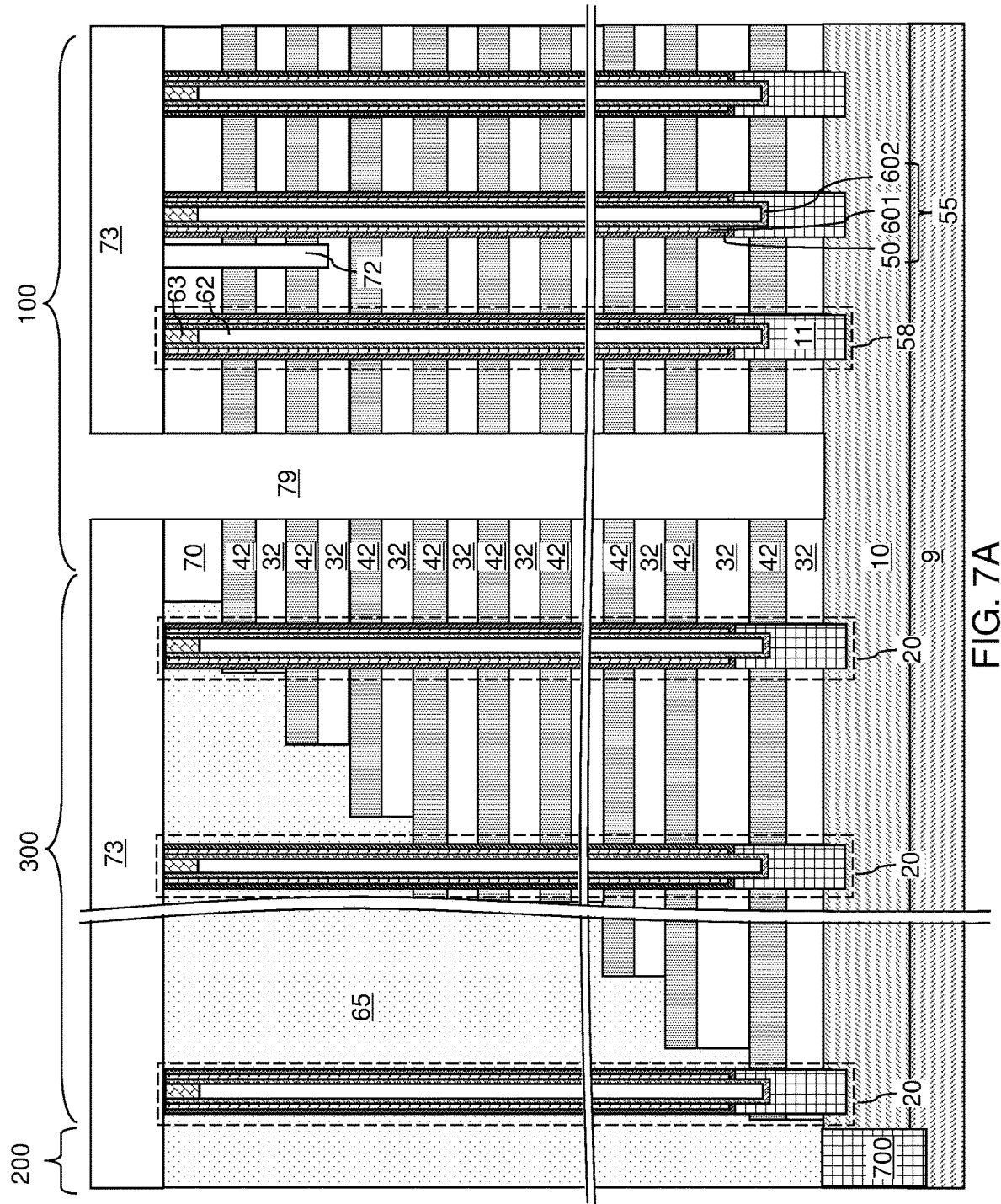
FIG. 7A is a schematic vertical cross-sectional view of the exemplary structure after formation of backside trenches according to an embodiment of the present disclosure.
Figure 7B:
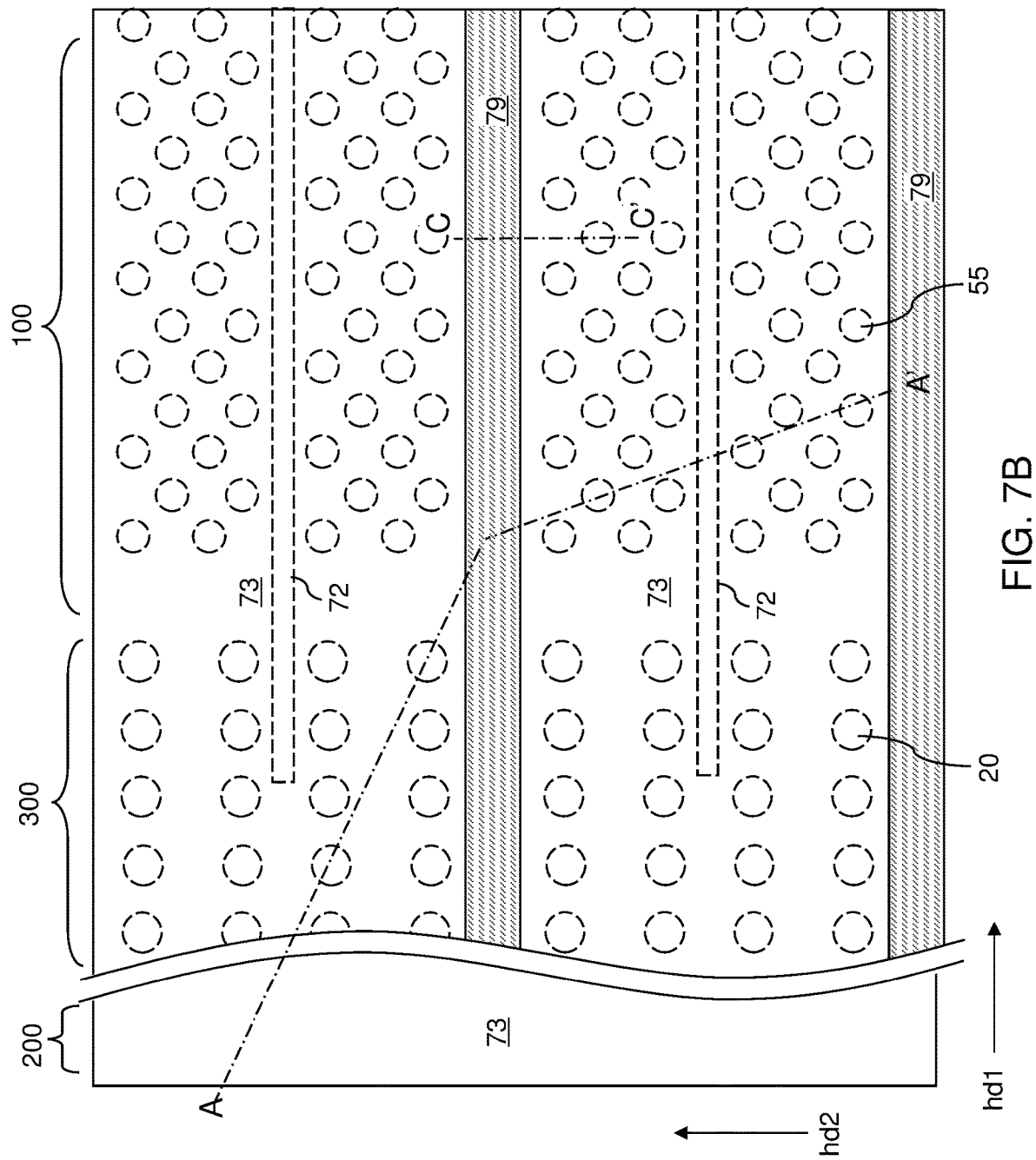
FIG. 7B is a partial see-through top-down view of the exemplary structure of FIG. 7A. The vertical plane A-A' is the plane of the schematic vertical cross-sectional view of FIG. 7A.
Figure 7C:
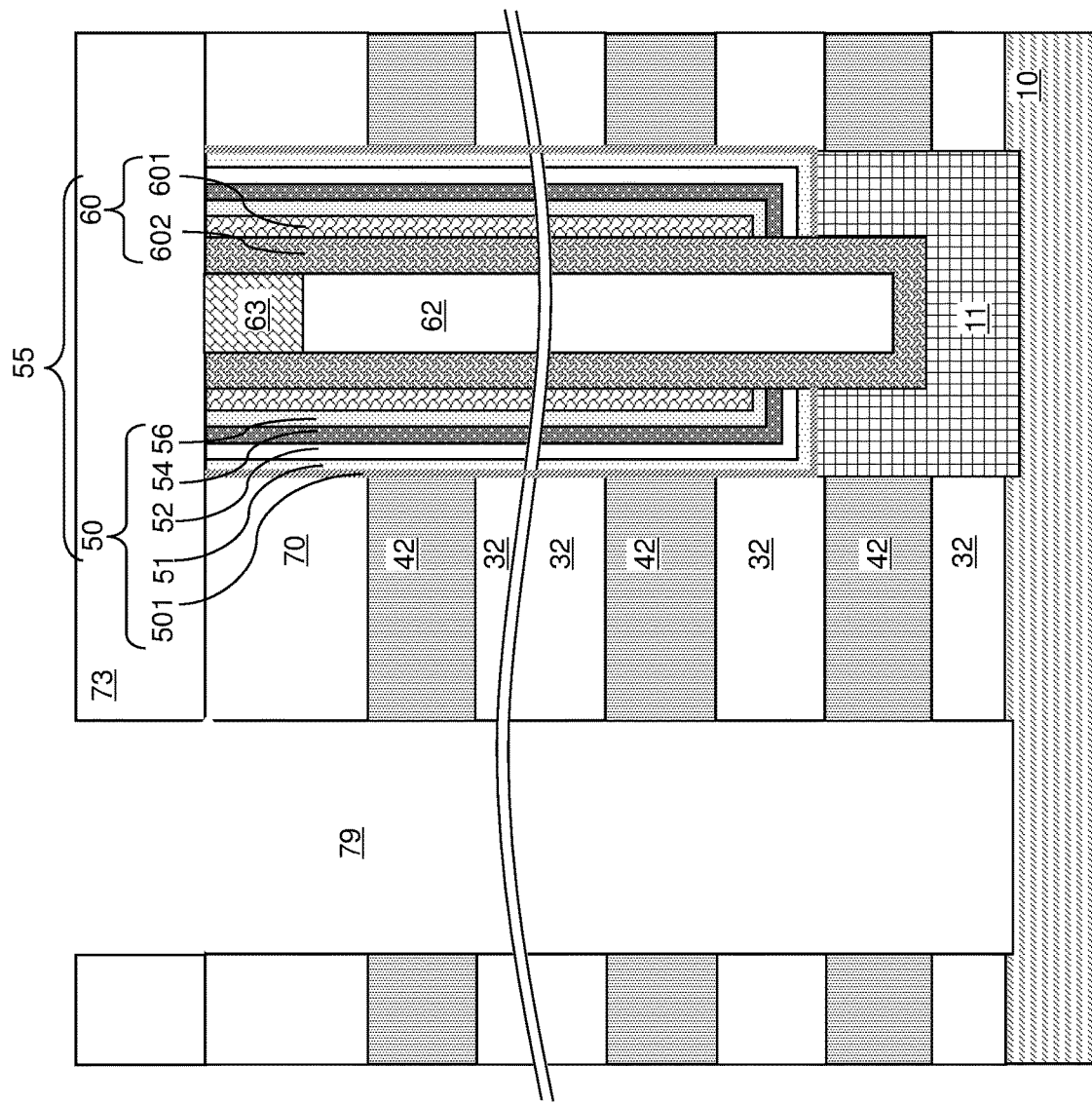
FIG. 7C is a schematic vertical cross-sectional view along the vertical plane C-C' of the exemplary structure of FIG. 7B.

Referring to FIGS. 7A-7C, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
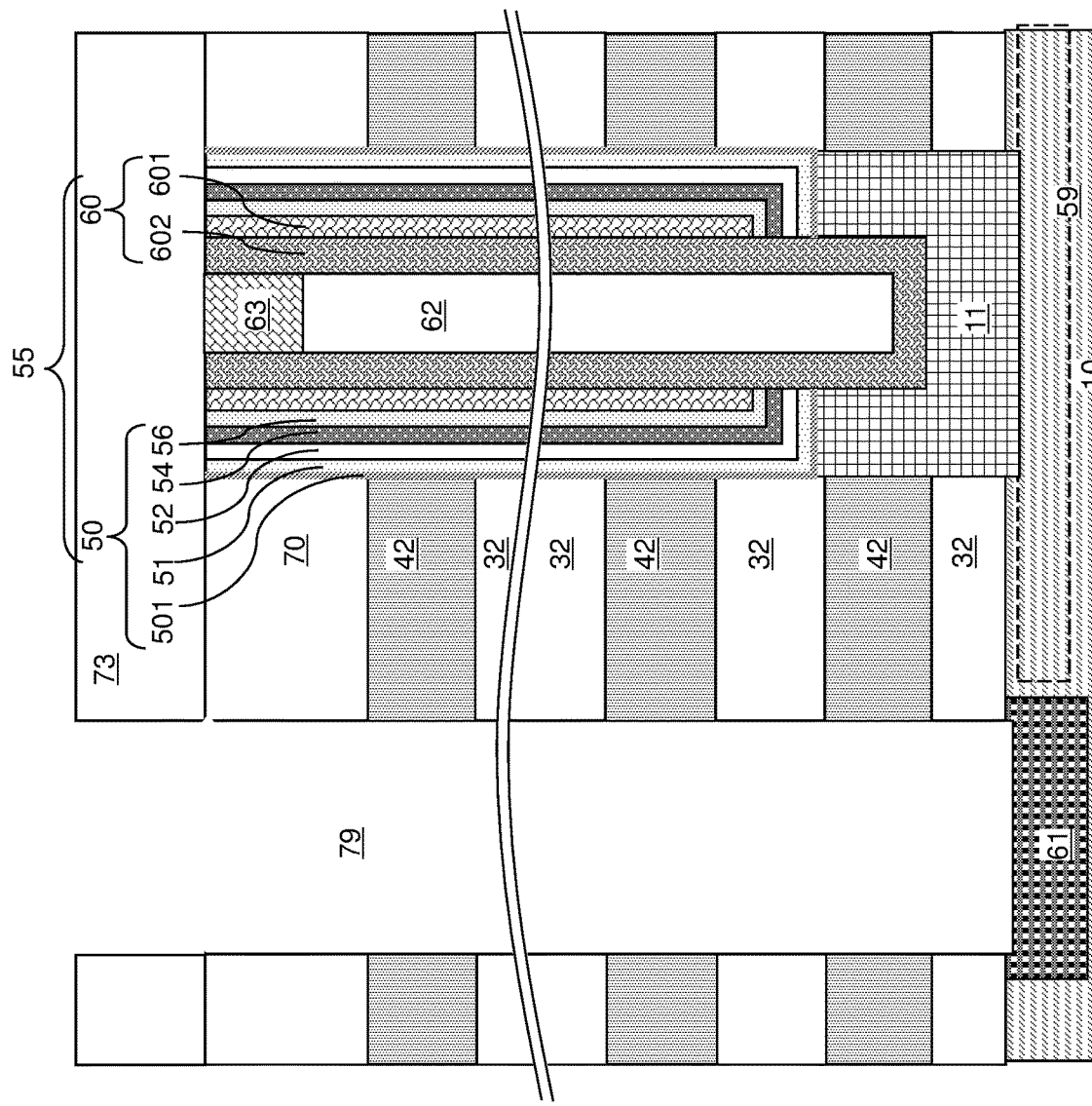
FIG. 8 is a schematic vertical cross-sectional view of a region of the exemplary structure after formation of a source region underneath each backside trench according to an embodiment of the present disclosure.

Referring to FIG. 8, dopants of the second conductivity can be implanted into surface portions of the semiconductor material layer 10 that underlies the backside trenches 79. A source region 61 can be formed at a surface portion of the semiconductor material layer 10 under each backside trench 79. The dose of the dopants of the second conductivity type is selected such that a p-n junction is formed between each source region 61 and unimplanted portions of the semiconductor material layer 10. The atomic concentration of the dopants of the second conductivity type in the source regions 61 can be in a range from $5.0 \times 10^{19}/cm^3$ to $2.0 \times 10^{20}/cm^3$, although lesser and greater dopant concentrations can also be employed. Due to the straggle of the implanted dopant atoms during the implantation process and lateral diffusion of the implanted dopant atoms during a subsequent activation anneal process, each source region 61 can have a lateral extent greater than the lateral extent of a respective overlying backside trench 79. The source regions 61 can be amorphized due to the heavy dose of the implanted dopants of the second conductivity type, and thus, the dopants of the second conductivity type in the source regions 61 are not electrically active until a subsequent anneal process that recrystallizes the source regions 61.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. Semiconductor channels (59, 11, 60) extend between each source region 61 and a respective set of drain regions 63. The semiconductor channels (59, 11, 60) include the vertical semiconductor channels 60 of the memory stack structures 55.

Figure 9A:
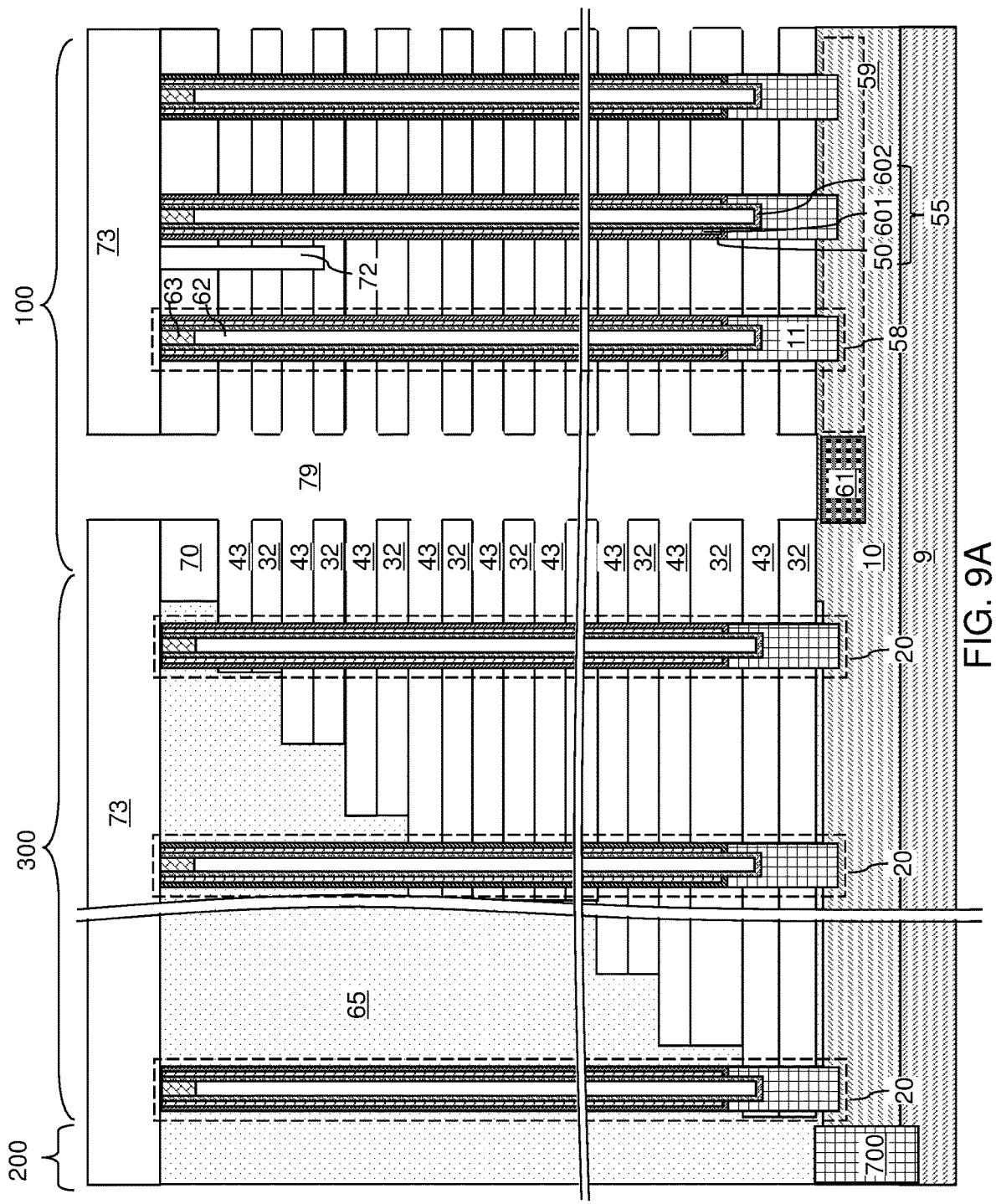
FIG. 9A is a schematic vertical cross-sectional view of the exemplary structure after formation of backside recesses according to an embodiment of the present disclosure.
Figure 9B:
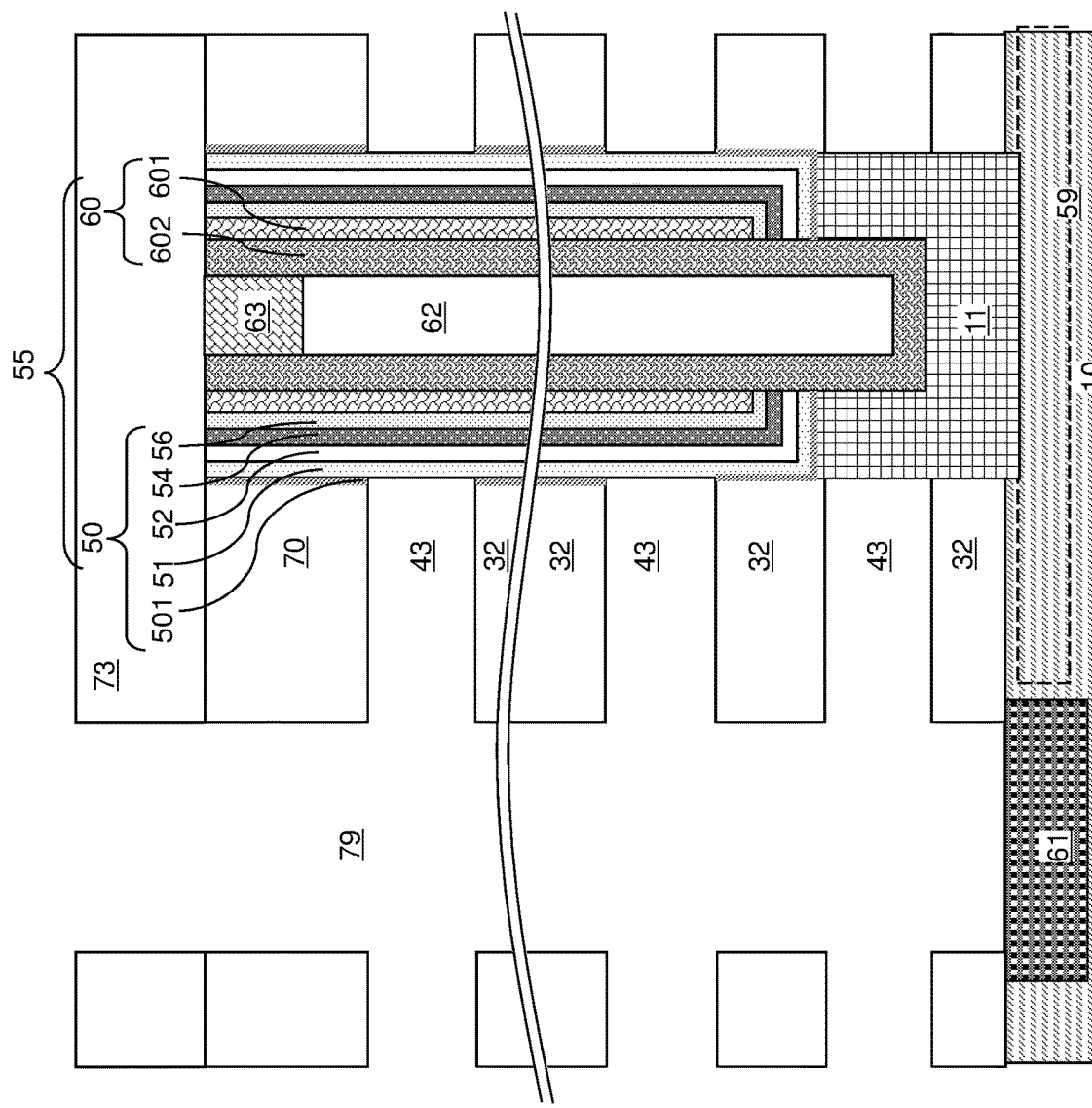
FIG. 9B is a schematic vertical cross-section view of a region of the exemplary structure at the processing steps of FIG. 9A.

Referring to FIG. 9B, an etchant that selectively etches the second material of the sacrificial material layers 42 with respect to the first material of the insulating layers 32 can be introduced into the backside trenches 79, for example, employing an etch process. If present, the silicon oxide liners 501 may be employed as etch stop layers. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

In case a silicon oxide liner 501 is present in each memory film 50, physically exposed portions of the silicon oxide liners 501 can be etched selective to the material of the crystalline blocking dielectric metal oxide layer 51 by a terminal etch step, which can include a wet etch process employing dilute hydrofluoric acid. Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 10A:
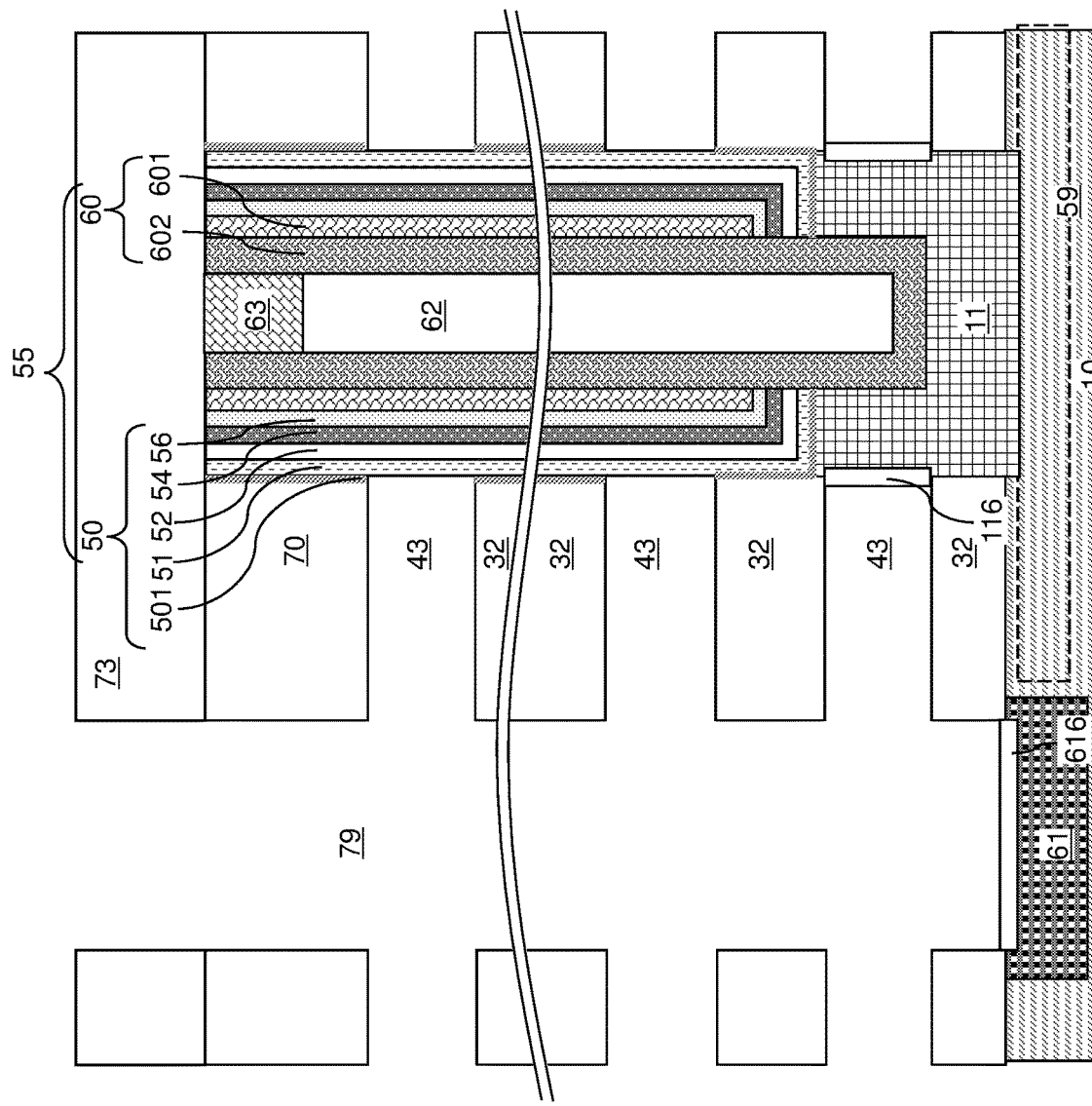
FIG. 10A is a schematic vertical cross-section view of a region of the exemplary structure after an oxidation process that includes an anneal process according to an embodiment of the present disclosure.

Referring to FIG. 10A, physically exposed surface portions of the optional pedestal channel portions 11 and the source regions 61 can be converted into dielectric oxide portions by a thermal oxidation process. The thermal oxidation process can convert a surface portion of each pedestal channel portion 11 into a tubular dielectric spacer 116, and can convert each physically exposed surface portion of the source regions 61 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus.

The tubular dielectric spacers 116 include a dielectric oxide material that contains the same semiconductor element as the pedestal channel portions 11 and additionally includes oxygen atoms. Thus, the material of the tubular dielectric spacers 116 comprises, and/or consists essentially of, a dielectric oxide of the semiconductor material of the pedestal channel portions 11. Likewise, each planar dielectric portion 616 includes a dielectric oxide material that contains the same semiconductor element as the semiconductor material layer 10 and additionally includes oxygen atoms. In one embodiment, the planar dielectric portions 616 can include a dielectric oxide of the semiconductor material of the semiconductor material layer 10.

The thermal oxidation of the surface portions of the semiconductor material layer 10 and the pedestal channel portions 11 into dielectric material portions (such as the tubular dielectric spacers 116 and the planar dielectric portions 616) can be performed at an elevated temperature. The thermal oxidation process can be performed at an elevated temperature in an oxidizing ambient. The thermal oxidation can be performed by a rapid thermal anneal (RTA) process with a peak temperature in a range from 950 degrees Celsius to 1,050 degrees Celsius. The duration of the peak temperature during the RTA process can be in a range from 1 second to 30 seconds, although lesser and greater durations can also be employed. Alternatively, the thermal oxidation can be performed by a furnace anneal process with a lower peak temperature and a longer duration of the peak temperature than the RTA process.

The temperature and the duration of the anneal process can be selected such that the dopants of the second conductivity type in the source regions 61 and the drain region 63 are electrically activated. If the dopants of the first conductivity type in the semiconductor channels 60 are not already activated, the dopants of the first conductivity type in the semiconductor channels 60 can be activated during the anneal process. The amorphous doped semiconductor material portions in the source regions 61 can be recrystallized into single crystalline doped semiconductor material portions during the anneal process. The dopants of the second conductivity type are incorporated into substitutional sites in the single crystalline structure of the source regions 61 during the anneal process, and the source regions 61 can be converted into a conductive material, i.e., a material having electrical conductivity greater than $1.0 \times 10^5$ S/m. Likewise, if the drain regions 63 and the semiconductor channels 60 include any amorphous semiconductor material, such an amorphous semiconductor material can be crystalized into a polycrystalline semiconductor material, such as doped polysilicon.

Figure 10B:
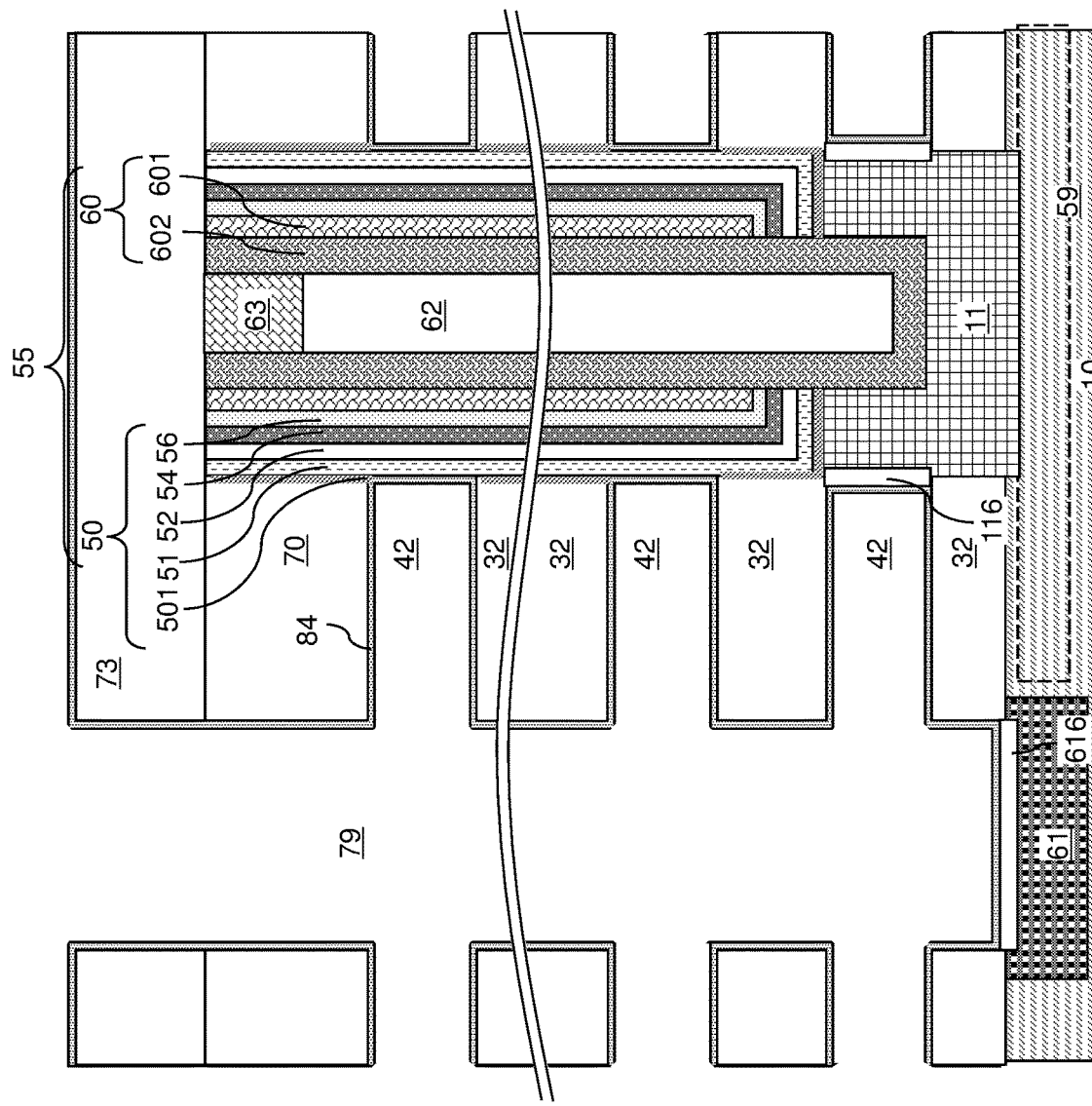
FIG. 10B is a schematic vertical cross-section view of a region of the exemplary structure after formation of an amorphous dielectric nucleation layer according to an embodiment of the present disclosure.

Referring to FIG. 10B, an amorphous dielectric nucleation layer 84 including an amorphous dielectric metal oxide material can be can be formed on physically exposed surfaces of the backside trenches 79 and the backside recesses 43. The amorphous dielectric nucleation layer 84 can be conformally formed directly on physically exposed surfaces of the insulating layers 32 and outer sidewalls of the crystalline blocking dielectric metal oxide layers 51. The amorphous dielectric metal oxide material of the amorphous dielectric nucleation layer 84 includes an amorphous dielectric metal oxide material such as aluminum oxide ($Al_2O_3$), hafnium oxide ($HfO_2$), lanthanum oxide ($LaO_2$), yttrium oxide ($Y_2O_3$), or tantalum oxide ($Ta_2O_5$) in an amorphous phase. The amorphous dielectric nucleation layer 84 may comprise the same or different composition of material as the crystalline blocking dielectric metal oxide layer 51.

The thickness of the amorphous dielectric nucleation layer 84 can be minimized while providing a coverage of more than 90%, such as more than 98%, of the physically exposed surfaces of the insulating layers 32 and the crystalline blocking dielectric metal oxide layers 51 in the memory films 50. For example, the thickness of the amorphous dielectric nucleation layer 84 can be in a range from 0.3 nm to 1 nm, such as from 0.3 nm to 0.6 nm. The amorphous dielectric nucleation layer 84 may be thinner (e.g., at least two times thinner, such as two to ten times thinner) than the crystalline blocking dielectric metal oxide layer 51. Minimizing the thickness of the amorphous dielectric nucleation layer 84 provides the advantage of increasing the remaining volume of the backside recesses 43 in which electrically conductive layers can be subsequently formed. The amorphous dielectric metal oxide material of the amorphous dielectric nucleating layer 84 provides a nucleation surface for a crystalline metallic liner to be subsequently deposited. Without wishing to be bound by a particular theory, it is believed that the crystalline metallic liner to be subsequently deposited can nucleate with a larger grain size on an amorphous material of the amorphous dielectric nucleating layer 84 than on a crystalline nucleation surface, and which results in improved fluorine blocking property.

In one embodiment, the amorphous dielectric nucleation layer 84 can be formed by a conformal deposition process such as atomic layer deposition (ALD). The amorphous dielectric nucleation layer 84 can consist essentially of an amorphous aluminum oxide material. In case the crystalline blocking dielectric metal oxide layers 51 includes a first amorphous aluminum oxide material in a crystalline phase, the amorphous aluminum oxide material of the amorphous dielectric nucleation layer 84 is herein referred to as a second aluminum oxide material. The first aluminum oxide material can be deposited in an amorphous phase during formation of the memory opening fill structures 58, and can be subsequently converted into a polycrystalline aluminum oxide material prior to formation of the amorphous dielectric nucleation layer 84. In one embodiment, each of the crystalline blocking dielectric metal oxide layers 51 consists essentially of a first aluminum oxide material in a polycrystalline phase, and the amorphous dielectric nucleation layer 84 consists essentially of a second aluminum oxide material in an amorphous phase.

Figure 10C:
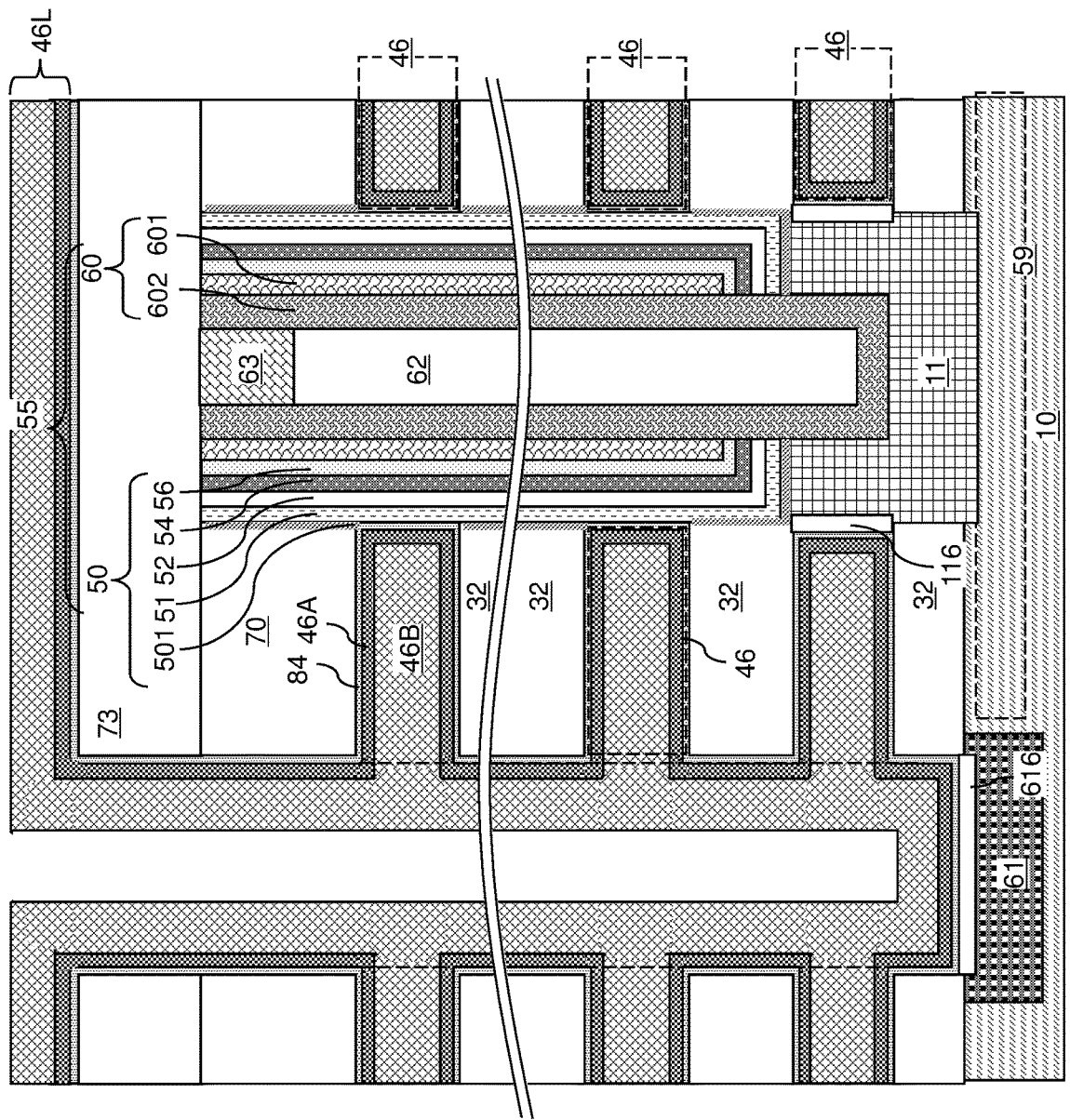
FIG. 10C is a schematic vertical cross-section view of a region of the exemplary structure after formation of a crystalline metallic liner and a conductive fill material layer according to an embodiment of the present disclosure.

Referring to FIG. 10C, electrically conductive layers 46 can be deposited in remaining volumes of the backside recesses 43 employing a nucleation process that forms a crystalline metallic liner 46A on the amorphous dielectric nucleation layer 84. The crystalline metallic liner 46A can be deposited directly on the physically exposed surfaces of the amorphous dielectric nucleation layer 84. The crystalline metallic liner 46A includes an electrically conductive metallic material that can function as a diffusion barrier layer and/or adhesion promotion layer for a metallic fill material to be subsequently deposited. The crystalline metallic liner 46A can include a conductive metallic nitride material such as TiN, TaN, or WN. In one embodiment, the crystalline metallic liner 46A can be deposited by a conformal deposition process such as chemical vapor deposition (CVD) or atomic layer deposition (ALD). The thickness of the crystalline metallic liner 46A can be in a range from 1.5 nm to 6 nm, such as from 2 nm to 4 nm, although lesser and greater thicknesses can also be employed. In one embodiment, the crystalline metallic liner 46A can consist essentially of a conductive metal nitride such as TiN. The amorphous dielectric nucleation layer 84 is deposited in an amorphous phase and remains amorphous until after formation of the electrically conductive layers 46.

According to an aspect of the present disclosure, the crystalline metallic liner 46A can be formed directly on the amorphous dielectric nucleation layer 84. The crystalline metallic liner 46A is laterally spaced from the crystalline blocking dielectric metal oxide layers 51 by vertically-extending cylindrical portions of the amorphous dielectric nucleation layer 84. Further, the crystalline metallic liner 46A is vertically spaced from the insulating layers 32 by horizontally-extending portions of the amorphous dielectric nucleation layer 84. In other words, the crystalline sidewall surfaces of the crystalline blocking dielectric metal oxide layers 51 are covered by the vertical cylindrical portions of the amorphous dielectric nucleation layer 84, and horizontal silicon oxide surfaces of the insulating layers 32 can be covered by horizontally-extending portions of the amorphous dielectric nucleation layer 84. Without wishing to be bound by a particular theory, it is believed that nucleation characteristics of the crystalline metallic liner 46A are determined by the surface properties of the amorphous dielectric nucleation layer 84. The amorphous nature of the physically exposed surfaces of the amorphous dielectric nucleation layer 84 is believed to provide nucleation of the metallic nitride material of the crystalline metallic liner 46A with a larger grain than a crystalline nucleation surface or a surface of silicon oxide.

Without wishing to be bound by a particular theory, the amorphous surface of the amorphous metal oxide dielectric material in the amorphous dielectric nucleation layer 84 (such as the amorphous surface of an amorphous aluminum oxide material) may improve the morphology of the crystalline metallic liner 46A by making the coverage of the crystalline metallic liner 46A more uniform and improving the continuity of the crystalline metallic liner 46A, and thereby reducing the thickness variations in the crystalline metallic liner 46A. Further, the amorphous surface of the amorphous metal oxide dielectric material in the amorphous dielectric nucleation layer 84 may increase the average grain size of the crystalline metallic liner 46A.

The uniform thickness of the crystalline metallic liner 46A and the reduction of grain boundaries (due to larger grain sizes) in the crystalline metallic liner 46A can enhance the effectiveness of the crystalline metallic liner 46A as a fluorine-diffusion-barrier structure, and thus, reduces fluorine diffusion from a metallic fill material (e.g., tungsten) to be subsequently deposited in remaining volumes of the backside recesses 43 toward the insulating layers 32 and/or toward the crystalline blocking dielectric metal oxide layers 51. As discussed above, the thickness of the amorphous dielectric nucleation layer 84 can be minimized to a monolayer level, such as a range from 0.3 nm to 1 nm, to minimize the total volume of the backside recesses 43 that is occupied by the amorphous dielectric nucleation layer 84. Thus, the crystalline blocking dielectric metal oxide layers 51 can function as an effective blocking dielectric for the charge storage layers 54, and leakage or tunneling of electrical charges through the crystalline blocking dielectric metal oxide layers 51 can be reduced or prevented. The amorphous dielectric nucleation layer 84 is employed as a thin nucleation template layer that is thinner than the crystalline blocking dielectric metal oxide layers 51 at least by a factor of two, such as at least a factor of three, and induces formation of a crystalline metallic liner 46A with more uniform thickness, less grain boundaries, and larger average grain sizes that improves a fluorine barrier property of the material of the crystalline metallic liner 46A and induces formation of large grains in a metal fill material to be subsequently deposited.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal, such as tungsten. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the crystalline metallic liner 46A, which is a crystalline metallic liner that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the crystalline metallic liner 46A and a portion of the metallic fill material layer 46B that are located between a vertically neighboring pair of dielectric material layers such as a pair of insulating layers 32. The continuous electrically conductive material layer 46L includes a continuous portion of the crystalline metallic liner 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the amorphous dielectric nucleation layer 84 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
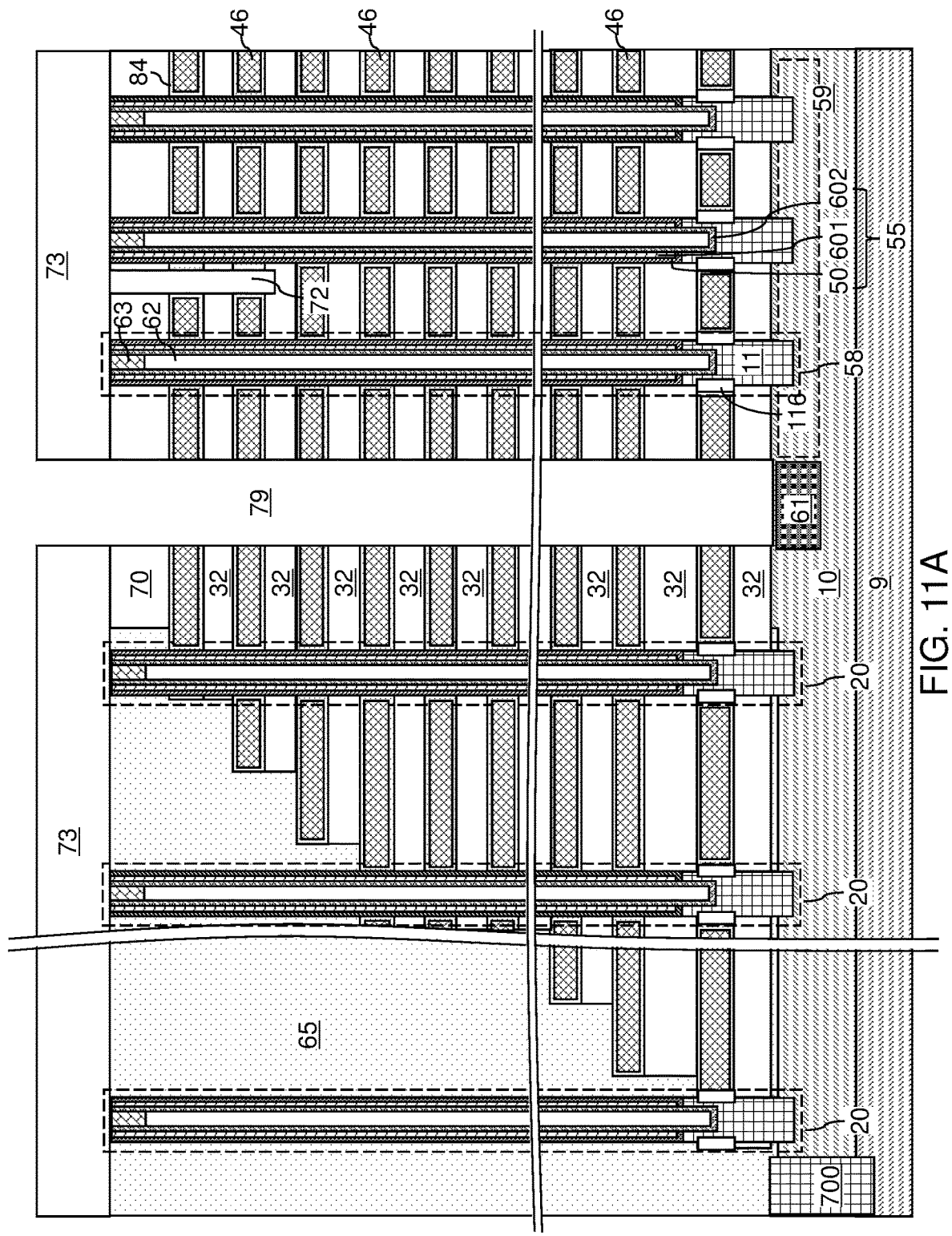
FIG. 11A is a schematic vertical cross-sectional view of the exemplary structure after removal of portions of the conductive fill material layer, the crystalline metallic liner, and the amorphous dielectric nucleation layer located in the backside trenches or overlying a contact-level dielectric layer according to an embodiment of the present disclosure.
Figure 11B:
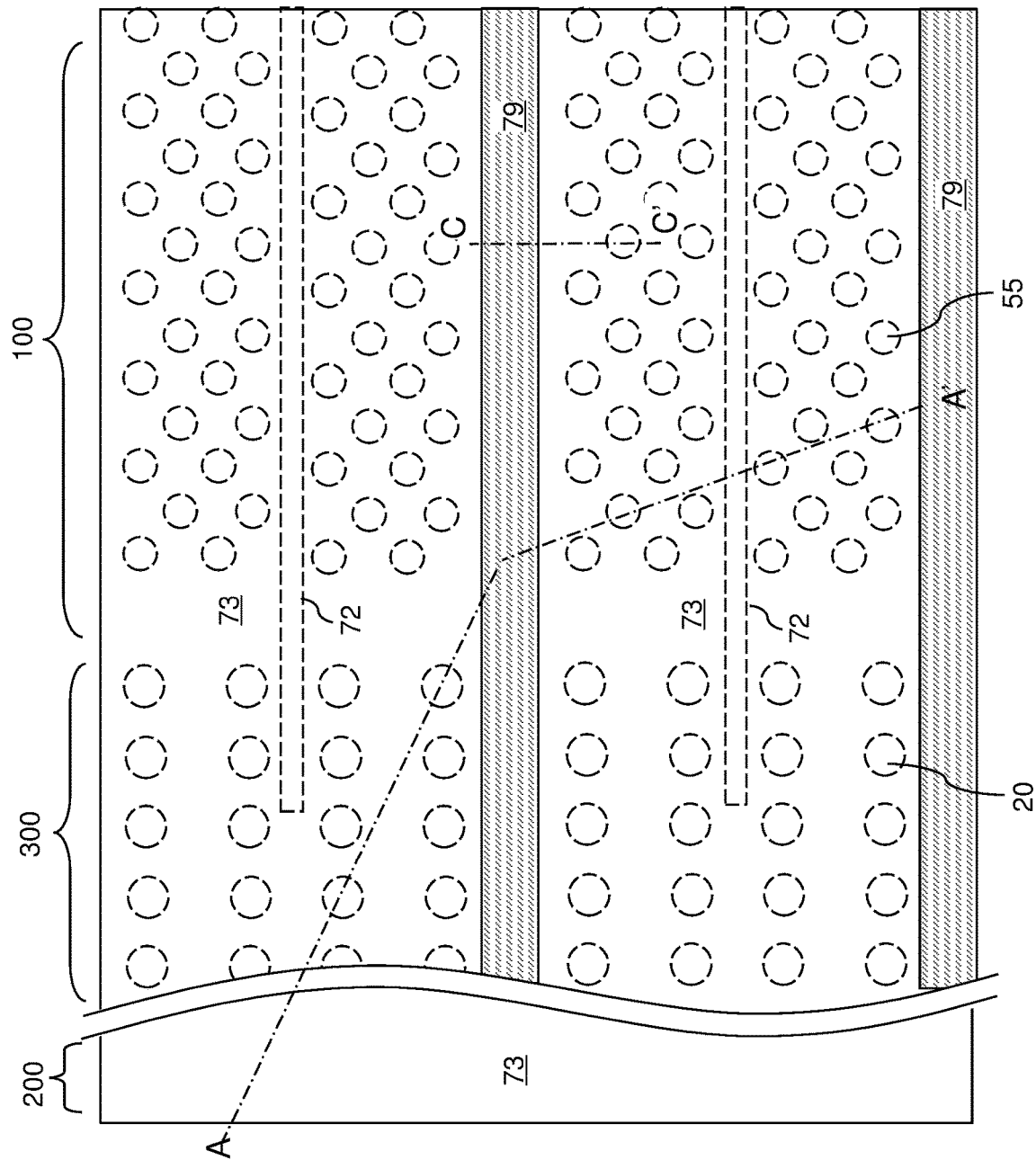
FIG. 11B is a partial see-through top-down view of the exemplary structure of FIG. 11A. The vertical plane A-A' is the plane of the schematic vertical cross-sectional view of FIG. 11A.
Figure 11C:
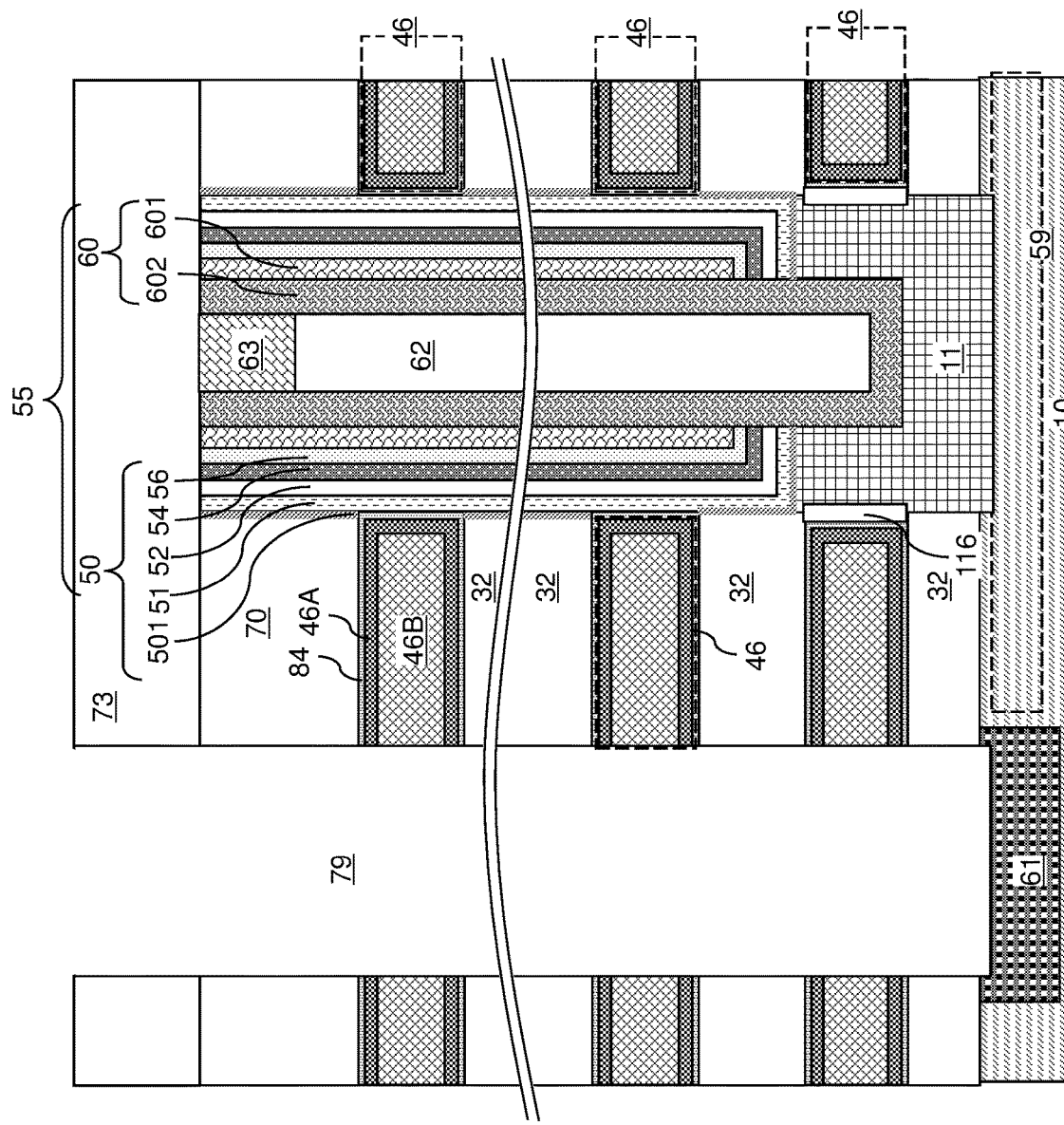
FIG. 11C is a schematic vertical cross-sectional view along the vertical plane C-C' of the exemplary structure of FIG. 11B.

Referring to FIGS. 11A-11C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the amorphous dielectric nucleation layer 84. In this case, a horizontal portion of the amorphous dielectric nucleation layer 84 can be present at the bottom of each backside trench 79. In another embodiment, the removal of the continuous electrically conductive material layer 46L may not be selective to the material of the amorphous dielectric nucleation layer 84. In this embodiment, the amorphous dielectric nucleation layer 84 exposed in the backside trench after removal of the continuous electrically conductive material layer 46L and the planar dielectric portions 616 can be removed during removal of the continuous electrically conductive material layer 46L. A backside cavity is present within each backside trench 79.

Figure 12:
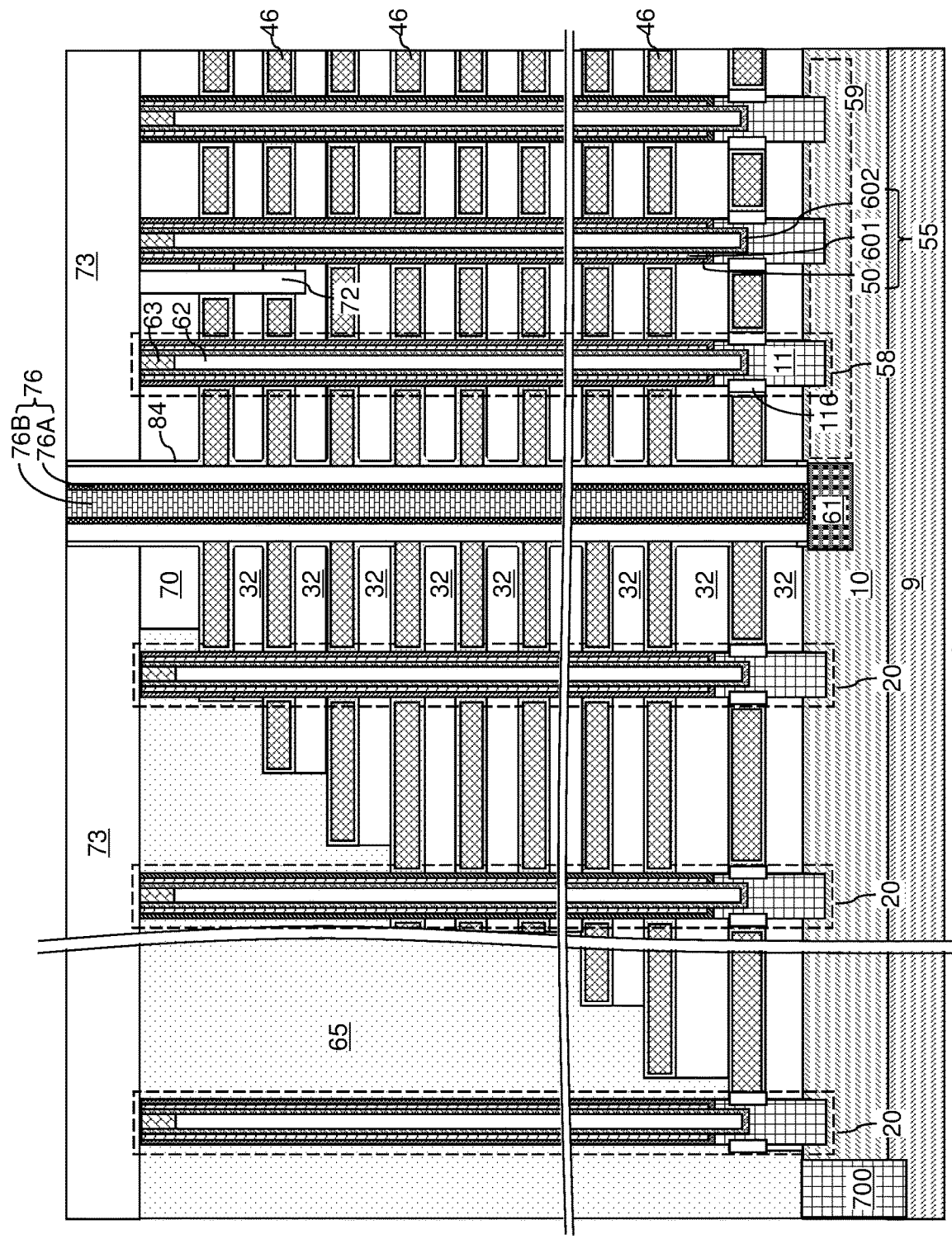
FIG. 12 is a schematic vertical cross-sectional view of the exemplary structure after formation of an insulating spacer and a backside contact structure according to an embodiment of the present disclosure.

Referring to FIG. 12, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If the amorphous dielectric nucleation layer 84 is still present at a periphery of each backside trench 79, then the insulating material layer can be formed directly on surfaces of the amorphous dielectric nucleation layer 84 and directly on the sidewalls of the electrically conductive layers 46. If the amorphous dielectric nucleation layer 84 is not present at a periphery of each backside trench 79, then the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. Any remaining portions of the amorphous dielectric nucleation layer 84 and the planar dielectric portion exposed at the bottom of the insulating spacer 74 in in the backside trench 79 are also removed. A backside cavity is present within a volume surrounded by each insulating spacer 74. A top surface of a respective source region 61 can be physically exposed at the bottom of each backside trench 79.

A backside contact via structure 76 can be formed within each backside cavity. Each contact via structure 76 can fill a respective backside cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of a respective source region 61.

Figure 13A:
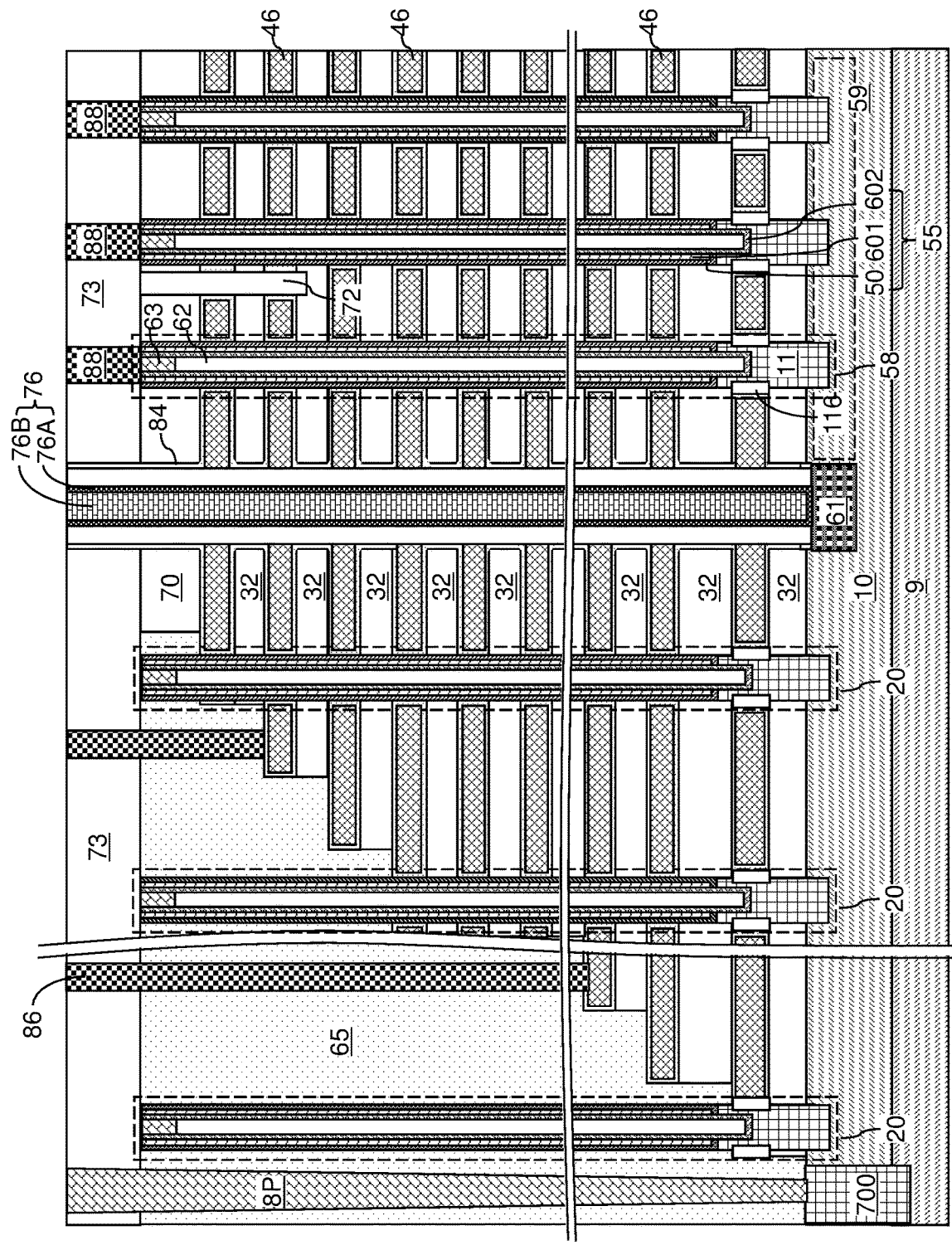
FIG. 13A is a schematic vertical cross-sectional view of the exemplary structure after formation of additional contact via structures according to an embodiment of the present disclosure.
Figure 13B:
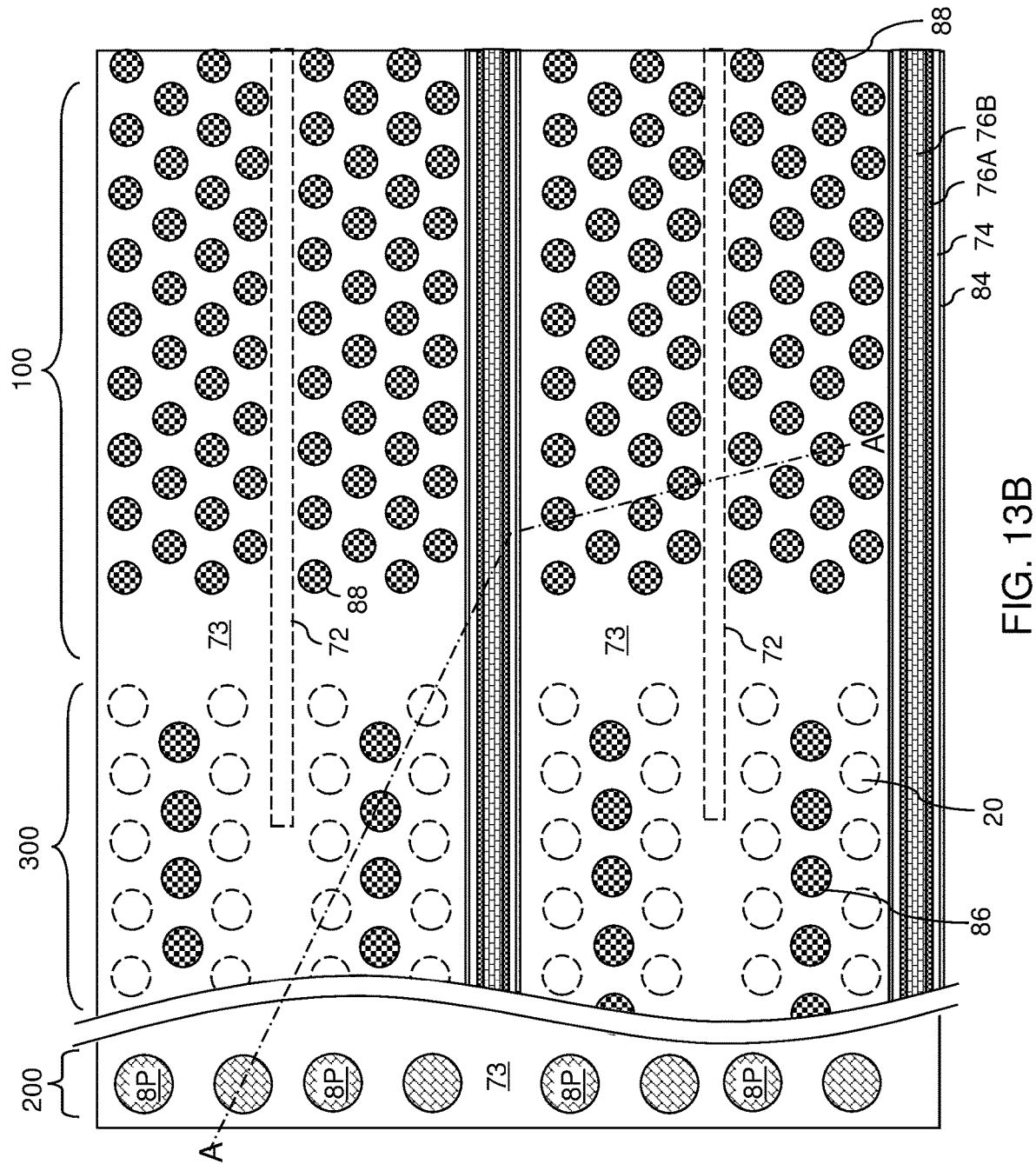
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings can be located over another memory cell (comprising another portion of the charge storage layer 54 at a level of another electrically conductive layer 46) in a second device level of the array of monolithic three-dimensional NAND strings. The silicon substrate can contain an integrated circuit comprising a driver circuit (comprising a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element can be located adjacent to a respective one of the plurality of semiconductor channels (59, 11, 60).

Referring to all drawings and according to various embodiments of the present disclosure, a semiconductor structure includes an alternating stack of insulating layers 32 and electrically conductive layers 46 located over a substrate (9, 10); memory openings 49 vertically extending through the alternating stack (32, 46), and memory opening fill structures 58 located in the memory openings 49, wherein each of the memory opening fill structures 58 comprises a memory film 50 and a vertical semiconductor channel 60 that extend vertically, and each memory film 50 comprises a blocking dielectric metal oxide layer 51, and a metal oxide amorphous dielectric nucleation layer 84 located between each of the vertically neighboring electrically conductive layers 46 and insulating layers 32, and located between each of the crystalline blocking dielectric metal oxide layers 51 and each of the electrically conductive layers 46.

In one embodiment, each of the electrically conductive layers 46 comprises a respective crystalline metallic nitride liner 46A that contacts the amorphous dielectric nucleation layer 84 and respective tungsten conductive fill material portion 46B that is embedded in the respective crystalline metallic nitride liner. The amorphous dielectric nucleation layer 84 contacts a sidewall of the blocking dielectric metal oxide layer 51 in the memory stack structure.

In one embodiment, drain regions 63 are located in the memory opening fill structures 58, and can contact an upper end of a respective one of the semiconductor channels 60.

In one embodiment, each of the memory opening fill structures 58 comprises a silicon oxide blocking dielectric layer 52 located on a respective one of the crystalline blocking dielectric metal oxide layers 51. Each of the memory opening fill structures 58 also comprises a charge storage layer 54 and a tunneling dielectric layer 56 located the silicon oxide blocking dielectric layer 52, and each of the semiconductor channels 60 is located on a respective one of the tunneling dielectric layers 56 in each memory opening fill structure.

In one embodiment, each of the crystalline blocking dielectric metal oxide layers 51 consists essentially of a polycrystalline aluminum oxide material, and the amorphous dielectric nucleation layer 84 consists essentially of an amorphous aluminum oxide material. Each of the crystalline blocking dielectric metal oxide layers 51 is thicker than the amorphous dielectric nucleation layer 84.

The various embodiments of the present disclosure can be employed to provide a more uniform nucleation for the crystalline metallic liners 46A, to enhance thickness uniformity of the crystalline metallic liners 46A, to increase the average grain size of the crystalline metallic liners 46A, and to enhance effectiveness of the crystalline metallic liners 46A as a fluorine diffusion barrier layer through reduction of grain boundaries. At the same time, the thickness of the amorphous dielectric nucleation layer 84 is minimized while providing a continuous coverage of the crystalline blocking dielectric metal oxide layers 51 and the insulating layers 32, and provide more volume for the electrically conductive layers 46 so that the resistance of each electrically conductive layer 46 can be reduced through increase in volume. Further, the large grain size of the crystalline metallic liners 46A can induce formation of large grains in the metallic fill material layers 46B, thereby reducing the resistivity of metallic fill material layers 46B.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a semiconductor structure, comprising:

forming an alternating stack of insulating layers and sacrificial material layers over a substrate;

forming memory openings vertically extending through the alternating stack;

forming memory opening fill structures in the memory openings, wherein each of the memory opening fill structures comprises a memory film and a vertical semiconductor channel that extend vertically, and each memory film comprises a blocking dielectric metal oxide layer and a continuous silicon oxide liner that laterally surrounds the blocking dielectric metal oxide layer;

forming backside recesses by removing the sacrificial material layers selective to the insulating layers and the memory opening fill structures;

dividing each continuous silicon oxide liner into a respective vertical stack of silicon oxide liners by performing an etch process to physically expose segments of outer sidewalls of the respective blocking dielectric metal oxide layer;

forming a dielectric metal oxide layer directly on physically exposed surfaces of the insulating layers and directly on the physically exposed segments of the outer sidewalls of the blocking dielectric metal oxide layers; and forming electrically conductive layers in remaining volumes of the backside recesses directly on the dielectric metal oxide layer.

2. The method of claim 1, wherein the blocking dielectric metal oxide layers are formed as amorphous dielectric metal oxide layers, and are subsequently converted into crystalline blocking dielectric metal oxide layers by an anneal process.

3. The method of claim 2, wherein the dielectric metal oxide layer is deposited directly on the crystalline blocking dielectric metal oxide layers.

4. The method of claim 2, further comprising: forming drain regions in the memory opening fill structures at an upper end of a respective one of the semiconductor channels; and forming source regions in, or on, upper portions of the substrate.

5. The method of claim 1, further comprising forming a blocking dielectric semiconductor compound layer on a respective one of the blocking dielectric metal oxide layers within each of the memory openings.

6. The method of claim 5, further comprising forming a charge storage layer and a tunneling dielectric layer on a respective one of the blocking dielectric semiconductor compound layers within each of the memory openings, wherein each of the memory films comprises a respective continuous silicon oxide liner, a respective blocking dielectric metal oxide layer, a respective blocking dielectric semiconductor compound layer, a respective charge storage layer, and a respective tunneling dielectric layer, and wherein each of the semiconductor channels is formed on a respective one of the tunneling dielectric layers.

7. The method of claim 1, wherein: each of the blocking dielectric metal oxide layers consists essentially of a first aluminum oxide material; and the dielectric metal oxide layer consists essentially of a second aluminum oxide material.

8. The method of claim 7, wherein: the first aluminum oxide material is deposited in an amorphous phase and is subsequently converted into a polycrystalline aluminum oxide material prior to formation of the dielectric metal oxide layer; and the dielectric metal oxide layer is deposited in an amorphous phase and remains amorphous until after formation of the electrically conductive layers.

9. The method of claim 1, further comprising: forming backside trenches through the alternating stack after formation of the memory opening fill structures; isotropically etching the sacrificial material layers selective to the insulating layers and the memory opening fill structures by introducing an isotropic etchant into the backside trenches; and conformally depositing the dielectric metal oxide layer on physically exposed surfaces of the backside trenches and the backside recesses.

10. The method of claim 9, further comprising: forming a metallic liner on the dielectric metal oxide layer; and filling remaining volumes of the backside recesses with a conductive fill material.

11. The method of claim 1, further comprising: forming stepped surfaces in a staircase region by patterning the alternating stack; forming a retro-stepped dielectric material portion of the stepped surfaces of the alternating stack; and forming contact via structures on a respective one of the electrically conducive layers through the retro-stepped dielectric material portion.

12. A semiconductor structure comprising:
an alternating stack of insulating layers and electrically conductive layers located over a substrate;
memory openings vertically extending through the alternating stack;
memory opening fill structures located in the memory openings, wherein each of the memory opening fill structures comprises a memory film and a vertical semiconductor channel that extend vertically, and each memory film comprises a blocking dielectric metal oxide layer and a vertical stack of silicon oxide liners that are vertically spaced apart, contact a respective one of the insulating layers, and laterally surround the blocking dielectric metal oxide layer; and
dielectric metal oxide layers located between each of the vertically neighboring electrically conductive layers and insulating layers, and located between each of the blocking dielectric metal oxide layers and each of the electrically conductive layers, wherein each of the electrically conductive layers is in direct contact with a respective one of the dielectric metal oxide layers.

13. The semiconductor structure of claim 12, wherein each of the electrically conductive layers comprises a respective metallic nitride liner that contacts the dielectric metal oxide layer and respective tungsten conductive fill material portion that is embedded in the respective metallic nitride liner.

14. The semiconductor structure of claim 12, wherein the dielectric metal oxide layer contacts a sidewall of the blocking dielectric metal oxide layer in the memory opening fill structure.

15. The semiconductor structure of claim 12, further comprising drain regions located in the memory opening fill structures and contacting an upper end of a respective one of the semiconductor channels.

16. The semiconductor structure of claim 12, wherein:
each of the memory opening fill structures further comprises a silicon oxide blocking dielectric, a charge storage layer and a tunneling dielectric layer; and
each of the semiconductor channels is located on a respective one of the tunneling dielectric layers in each memory opening fill structure.

17. The semiconductor structure of claim 12, wherein:
each of the blocking dielectric metal oxide layers consists essentially of a polycrystalline a luminum oxide material; and the dielectric metal oxide layer consists essentially of an amorphous aluminum oxide material.

18. The semiconductor structure of claim 12, further comprising:
retro-stepped dielectric material portions overlying stepped surfaces of the alternating stack;
a pair of insulating spacers laterally spaced apart from each other, vertically extending from a bottommost layer of the alternating stack to a topmost layer of the alternating stack, and contacting each layer within the alternating stack; and
a pair of backside contact via structures laterally surrounded by a respective one of the pair of insulating spacers,
wherein:
each of the electrically conductive layers consists of a respective crystalline metallic liner and a respective metallic fill material portion; and
all surfaces of the dielectric metal oxide layers a rein contact with a respective one of the electrically conductive layers, the pair of insulating spacers, the retro-stepped dielectric material portions, the blocking dielectric metal oxide layers of the memory opening fill structures, and the silicon oxide liners within the memory opening fill structures, and the insulating layers.

19. The method of claim 1, further comprising forming a backside trench through the alternating stack.

20. The method of claim 19, wherein the forming the electrically conductive layers comprises:
depositing a crystalline metallic liner directly on all physically exposed surfaces of the dielectric metal oxide layer;
depositing a metallic fill material layer directly on all physically exposed surfaces of the crystalline metallic liner, wherein a continuous layer comprising a portion of the crystalline metallic liner and a portion of the metallic fill material layer is formed in the backside trench, the continuous layer having a continuous vertically extending surface physically exposed in the backside trench; and
etching the continuous layer to form the electrically conductive layers.

* * * * *